(12) United States Patent
Lint et al.

(10) Patent No.: US 9,304,149 B2
(45) Date of Patent: Apr. 5, 2016

(54) CURRENT SENSING DEVICES AND METHODS

(71) Applicant: Pulse Electronics, Inc., San Diego, CA (US)

(72) Inventors: James Douglas Lint, Cardiff, CA (US); Fuxue Jin, San Diego, CA (US); Victor Aldaco, Chula Vista, CA (US); Russell L. Machado, San Diego, CA (US)

(73) Assignee: PULSE ELECTRONICS, INC., San Diego, CA (US)

( * ) Notice: Subject to any disclaimer, the term of this patent is extended or adjusted under 35 U.S.C. 154(b) by 12 days.

(21) Appl. No.: 13/797,575

(22) Filed: Mar. 12, 2013

(65) Prior Publication Data

US 2013/0320961 A1 Dec. 5, 2013

Related U.S. Application Data

(60) Provisional application No. 61/653,655, filed on May 31, 2012.

(51) Int. Cl.
*G01R 15/18* (2006.01)
*G01R 31/28* (2006.01)

(52) U.S. Cl.
CPC .............. *G01R 15/181* (2013.01); *G01R 31/28* (2013.01)

(58) Field of Classification Search
CPC ........ G01R 11/36; G01R 11/19; G01R 11/20; G01R 15/14; G01R 15/18; G01R 19/00; G01R 31/315; G01R 15/181; G01R 19/16547; G01R 19/0092; G01R 1/04; G01R 15/186; G01R 19/0084; G01R 19/2506; G01R 31/08; H01F 27/02; H01F 27/26; H01F 27/28; H01F 27/29; H01F 7/06; H02H 3/00; G06Q 50/06; H02J 13/0075; H02J 13/0013; H02J 3/1828; H02G 7/00

USPC ........ 324/76.11, 76.39, 76.75, 150, 654, 522, 324/536, 127

See application file for complete search history.

(56) References Cited

U.S. PATENT DOCUMENTS

| 750,594 A | 1/1904 | Henry |
| 2,470,598 A | 5/1949 | Biebesheimer |

(Continued)

FOREIGN PATENT DOCUMENTS

| CN | 1283795 A | 2/2001 |
| CN | 1189755 C | 2/2005 |

(Continued)

OTHER PUBLICATIONS

European Search Report for EP12180314 dated Nov. 29, 2012.

(Continued)

*Primary Examiner* — Vinh Nguyen
(74) *Attorney, Agent, or Firm* — Gazdzinski & Associates, PC

(57) ABSTRACT

A low-cost and high-precision current sensing device and methods for use and manufacturing. In one embodiment, the current sensing apparatus comprises a Rogowski-type coil which is manufactured in segments so as to facilitate the manufacturing process. In an exemplary embodiment, the current sensing apparatus segments are asymmetric in shape and/or composition (e.g., bobbin shape, size, and/or winding configuration) so as to account for asymmetries in the magnetic field distribution around a bus bar, or to accommodate its shape in a more compact form factor, and/or to improve the immunity to the effects of an external magnetic field. Methods of manufacturing and using the aforementioned current sensing apparatus are also disclosed.

20 Claims, 29 Drawing Sheets

(56) References Cited

U.S. PATENT DOCUMENTS

| | | |
|---|---|---|
| 2,949,591 A | 8/1960 | Craige |
| 3,340,353 A | 9/1967 | Mildner |
| 3,419,835 A | 12/1968 | Stein |
| 3,477,051 A | 11/1969 | Clark et al. |
| 3,605,055 A | 9/1971 | Grady |
| 3,614,554 A | 10/1971 | Shield et al. |
| 3,626,291 A | 12/1971 | Yauch et al. |
| 3,689,862 A | 9/1972 | Raymond |
| 3,699,488 A | 10/1972 | Goodman et al. |
| 3,947,795 A | 3/1976 | Donnelly et al. |
| 4,020,437 A | 4/1977 | Kern |
| 4,048,605 A | 9/1977 | McCollum |
| 4,091,349 A | 5/1978 | Niederjohn et al. |
| 4,103,268 A | 7/1978 | Anders et al. |
| 4,146,860 A | 3/1979 | Miller |
| 4,253,231 A | 3/1981 | Nouet |
| 4,352,079 A | 9/1982 | Mueller et al. |
| 4,378,525 A * | 3/1983 | Burdick .................. G01R 1/22 324/117 R |
| 4,547,961 A | 10/1985 | Bokil et al. |
| 4,611,191 A | 9/1986 | Souchere |
| 4,616,176 A | 10/1986 | Mercure |
| 4,687,987 A | 8/1987 | Kuchnir et al. |
| 4,700,131 A | 10/1987 | Miller |
| 4,709,205 A | 11/1987 | Baurand et al. |
| 4,777,381 A * | 10/1988 | Fernandes ..................... 307/64 |
| 4,847,986 A | 7/1989 | Meinel |
| 4,904,975 A | 2/1990 | Medenbach |
| 4,978,906 A | 12/1990 | Herbert et al. |
| 5,038,104 A | 8/1991 | Wikswo, Jr. et al. |
| 5,055,816 A | 10/1991 | Altman et al. |
| 5,066,904 A | 11/1991 | Bullock |
| 5,126,714 A | 6/1992 | Johnson |
| 5,220,488 A | 6/1993 | Denes |
| 5,257,000 A | 10/1993 | Billings et al. |
| 5,299,956 A | 4/1994 | Brownell et al. |
| 5,332,989 A | 7/1994 | Ching |
| 5,414,400 A | 5/1995 | Gris et al. |
| 5,430,613 A | 7/1995 | Hastings et al. |
| 5,442,280 A | 8/1995 | Baudart |
| 5,451,914 A | 9/1995 | Stengel |
| 5,461,309 A | 10/1995 | Baudart |
| 5,487,214 A | 1/1996 | Walters |
| 5,671,856 A | 9/1997 | Lisch |
| 5,726,615 A | 3/1998 | Bloom |
| 5,736,910 A | 4/1998 | Townsend et al. |
| 5,781,091 A | 7/1998 | Krone et al. |
| 5,892,420 A | 4/1999 | Larranaga et al. |
| 5,959,846 A | 9/1999 | Noguchi et al. |
| 5,982,265 A | 11/1999 | Von Skarczinski et al. |
| 6,018,239 A | 1/2000 | Berkcan et al. |
| 6,087,920 A | 7/2000 | Abramov |
| 6,094,044 A | 7/2000 | Kustera et al. |
| 6,148,500 A | 11/2000 | Krone et al. |
| 6,184,672 B1 | 2/2001 | Berkcan |
| 6,193,560 B1 | 2/2001 | Morana et al. |
| 6,225,560 B1 | 5/2001 | Machado |
| 6,270,380 B1 | 8/2001 | Shichida et al. |
| 6,313,623 B1 | 11/2001 | Kojovic et al. |
| 6,332,810 B1 | 12/2001 | Bareel |
| 6,409,547 B1 | 6/2002 | Reede |
| 6,414,475 B1 | 7/2002 | Dames et al. |
| 6,417,661 B1 | 7/2002 | Berkcan et al. |
| 6,428,362 B1 | 8/2002 | Phommachanh |
| 6,440,750 B1 | 8/2002 | Feygenson et al. |
| 6,445,271 B1 | 9/2002 | Johnson |
| 6,455,885 B1 | 9/2002 | Lin |
| 6,464,541 B1 | 10/2002 | Hashim et al. |
| 6,521,695 B1 | 2/2003 | Peruzzotti et al. |
| 6,545,456 B1 * | 4/2003 | Radosevich et al. ...... 324/117 H |
| 6,585,540 B2 | 7/2003 | Gutierrez et al. |
| 6,614,218 B1 | 9/2003 | Ray |
| 6,642,827 B1 | 11/2003 | McWilliams et al. |
| 6,655,988 B1 | 12/2003 | Simmons et al. |
| 6,677,850 B2 | 1/2004 | Dames |
| 6,696,910 B2 | 2/2004 | Nuytkens et al. |
| 6,731,193 B2 | 5/2004 | Meier et al. |
| 6,734,661 B2 | 5/2004 | Colby et al. |
| 6,769,166 B1 | 8/2004 | Blanchard |
| 6,769,936 B2 | 8/2004 | Gutierrez et al. |
| 6,822,547 B2 | 11/2004 | Saito et al. |
| 6,825,650 B1 * | 11/2004 | McCormack et al. ........ 324/127 |
| 6,848,943 B2 | 2/2005 | Machado et al. |
| 6,856,227 B2 | 2/2005 | Ushio et al. |
| 6,926,558 B2 | 8/2005 | Sasai et al. |
| 6,952,153 B2 | 10/2005 | Jacobson et al. |
| 6,962,511 B2 | 11/2005 | Gutierrez et al. |
| 6,963,195 B1 | 11/2005 | Berkcan |
| 6,965,225 B2 | 11/2005 | DeBuda |
| 7,078,888 B2 | 7/2006 | Budillon et al. |
| 7,106,162 B2 | 9/2006 | Saito |
| 7,109,837 B2 | 9/2006 | Watts et al. |
| 7,145,784 B2 | 12/2006 | Utsuno et al. |
| 7,158,005 B2 | 1/2007 | Pleskach et al. |
| 7,196,607 B2 | 3/2007 | Pleskach et al. |
| 7,218,198 B2 | 5/2007 | Pilniak et al. |
| 7,218,199 B1 | 5/2007 | Chang |
| 7,227,441 B2 | 6/2007 | Skendzic et al. |
| 7,227,442 B2 | 6/2007 | Skendzic |
| 7,241,181 B2 | 7/2007 | Machado et al. |
| 7,253,603 B2 | 8/2007 | Kovanko et al. |
| 7,271,697 B2 | 9/2007 | Whittaker et al. |
| 7,277,002 B2 | 10/2007 | Harding |
| 7,288,929 B2 * | 10/2007 | Prsha ..................... G01V 3/081 324/127 |
| 7,322,863 B2 | 1/2008 | Rapp et al. |
| 7,367,851 B2 | 5/2008 | Machado et al. |
| 7,405,643 B2 | 7/2008 | Jeong et al. |
| 7,408,434 B2 | 8/2008 | Lee et al. |
| 7,429,908 B2 | 9/2008 | Pilniak |
| 7,474,192 B2 | 1/2009 | Skendzic et al. |
| 7,477,128 B2 | 1/2009 | Quilici |
| 7,489,226 B1 | 2/2009 | Chignola et al. |
| 7,510,441 B2 | 3/2009 | Zhang et al. |
| 7,524,206 B2 | 4/2009 | Gutierrez et al. |
| 7,538,541 B2 | 5/2009 | Kojovic |
| 7,564,233 B2 | 7/2009 | Kojovic |
| 7,592,964 B2 | 9/2009 | Mullenborg et al. |
| 7,598,837 B2 | 10/2009 | Gilmartin |
| 7,598,839 B1 | 10/2009 | Wedley |
| 7,656,263 B2 | 2/2010 | Whittaker et al. |
| 7,661,994 B2 | 2/2010 | Machado et al. |
| 7,671,716 B2 | 3/2010 | Chen |
| 7,708,602 B2 | 5/2010 | Rascon et al. |
| 7,724,204 B2 | 5/2010 | Annamaa et al. |
| 7,819,699 B2 | 10/2010 | Xu et al. |
| 7,821,374 B2 | 10/2010 | Harrison et al. |
| 7,868,727 B2 | 1/2011 | Chen et al. |
| 7,961,072 B2 | 6/2011 | Pliniak et al. |
| 7,982,572 B2 | 7/2011 | Schaffer et al. |
| 8,193,891 B2 | 6/2012 | Gerhard et al. |
| 8,203,418 B2 | 6/2012 | Harrison et al. |
| 8,234,778 B2 | 8/2012 | Schaffer et al. |
| 8,319,628 B2 | 11/2012 | Schweitzer et al. |
| 2002/0158305 A1 | 10/2002 | Dalmia et al. |
| 2003/0011458 A1 | 1/2003 | Nuytkens et al. |
| 2003/0112000 A1 | 6/2003 | Sorenson, Jr. |
| 2004/0000968 A1 | 1/2004 | White et al. |
| 2004/0005820 A1 | 1/2004 | Gutierrez et al. |
| 2004/0150502 A1 | 8/2004 | Jacobson et al. |
| 2005/0059295 A1 | 3/2005 | Chen et al. |
| 2005/0088267 A1 | 4/2005 | Watts et al. |
| 2005/0208914 A1 | 9/2005 | Ogawa |
| 2005/0248430 A1 | 11/2005 | Dupraz et al. |
| 2006/0176139 A1 | 8/2006 | Pleskach et al. |
| 2006/0220774 A1 | 10/2006 | Skendzic |
| 2006/0290457 A1 | 12/2006 | Lee et al. |
| 2007/0001796 A1 | 1/2007 | Waffenschmidt et al. |
| 2007/0063807 A1 | 3/2007 | Quilici |
| 2007/0111598 A1 | 5/2007 | Quilici |
| 2007/0152651 A1 | 7/2007 | Shiokawa et al. |
| 2007/0210787 A1 | 9/2007 | Ebenezer et al. |
| 2007/0216510 A1 | 9/2007 | Jeong et al. |
| 2007/0282411 A1 | 12/2007 | Franz et al. |

(56) References Cited

U.S. PATENT DOCUMENTS

| | | |
|---|---|---|
| 2007/0285089 A1 | 12/2007 | Ibuki et al. |
| 2007/0290695 A1 | 12/2007 | Mahon |
| 2008/0007249 A1 | 1/2008 | Wilkerson et al. |
| 2008/0036448 A1 | 2/2008 | Kovach et al. |
| 2008/0077336 A1 | 3/2008 | Fernandes |
| 2008/0079418 A1 | 4/2008 | Rea et al. |
| 2008/0096426 A1 | 4/2008 | Chou Huang et al. |
| 2008/0106253 A1 | 5/2008 | Kojovic |
| 2008/0111226 A1 | 5/2008 | White et al. |
| 2008/0186124 A1 | 8/2008 | Schaffer et al. |
| 2008/0211484 A1 | 9/2008 | Howell et al. |
| 2008/0233803 A1 | 9/2008 | Renteria et al. |
| 2008/0303511 A1 | 12/2008 | Grno |
| 2009/0002111 A1 | 1/2009 | Harrison et al. |
| 2009/0058399 A1* | 3/2009 | Wang ................. G01R 1/22 324/127 |
| 2009/0077791 A1 | 3/2009 | Quilici |
| 2009/0200682 A1 | 8/2009 | Zhang |
| 2009/0231769 A1* | 9/2009 | Fischer et al. ............... 361/87 |
| 2010/0013460 A1 | 1/2010 | Ermisch et al. |
| 2010/0013589 A1 | 1/2010 | Schaffer et al. |
| 2010/0259275 A1 | 10/2010 | Grieshaber et al. |
| 2010/0295646 A1 | 11/2010 | Harrison et al. |
| 2011/0014800 A1 | 1/2011 | Cheng |
| 2011/0025304 A1 | 2/2011 | Lint et al. |
| 2011/0025305 A1 | 2/2011 | Lint et al. |
| 2011/0034081 A1 | 2/2011 | Feldman et al. |
| 2011/0074397 A1* | 3/2011 | Bulumulla et al. ......... 324/127 |
| 2011/0148561 A1* | 6/2011 | Lint et al. .................. 336/192 |
| 2011/0204879 A1 | 8/2011 | Peretto |
| 2011/0291789 A1 | 12/2011 | Dalmia et al. |
| 2012/0058676 A1 | 3/2012 | Schaffer et al. |
| 2012/0175970 A1* | 7/2012 | Jackman ................... 307/109 |
| 2013/0043967 A1 | 2/2013 | Rouaud et al. |
| 2013/0063125 A1 | 3/2013 | Chamarti et al. |
| 2013/0063129 A1 | 3/2013 | Chamarti et al. |
| 2013/0063131 A1 | 3/2013 | Chamarti et al. |
| 2013/0063161 A1 | 3/2013 | Chamarti et al. |

FOREIGN PATENT DOCUMENTS

| | | |
|---|---|---|
| CN | 1696712 A | 11/2005 |
| CN | 1270332 C | 8/2006 |
| CN | 1993782 | 7/2007 |
| CN | 101023364 A | 8/2007 |
| CN | 100407564 C | 7/2008 |
| CN | 101438172 | 5/2009 |
| CN | 201465698 U | 5/2010 |
| DE | 1278006 B | 9/1968 |
| DE | 2432919 A1 | 2/1976 |
| DE | 19712900 | 11/1997 |
| EP | 0555994 A1 | 8/1993 |
| EP | 0708459 A1 | 4/1996 |
| EP | 0756298 A2 | 1/1997 |
| GB | 987310 A | 3/1965 |
| JP | 2004186099 A | 7/2004 |
| TW | 234743 B | 11/1994 |
| TW | 312748 B | 8/1997 |
| TW | 1279819 B | 4/2007 |
| WO | WO-2009139521 A1 | 11/2009 |
| WO | WO-2010065113 A1 | 6/2010 |

OTHER PUBLICATIONS

Crotti, Et Al. "Analysis of Rogowski Coil Behavior Under Non Ideal Measurement Conditions" XIX IMEKO World Congress, Fundamental and Applied Metrology, Sep. 6-11, 2009, Lisbon, Portugal, pp. 879-881.0.

Iris, "Smart Grid Monitoring," Current Sensing for a Smarter Grid, Doc ref: 10068MAR10 V1.02, Sentec, http://www.sentec.co.uk/assets/library/document/i/original/iris_datasheet_1.02_vl_.pdf, (pp. 1-2).

An Overview of Rogowski Coil Current Sensing Technology; David E. Shepard, Tactical Marketing Manager and Donald W. Yauch Applications Manager; LEM DynAmp Inc.

"Practical Aspects of Rogowski Coil Applications to Relaying" by Kojovic, et al. Sep. 2010.

"International Search Report and Written Opinion for Application No. PCT/US2010/033909, mailed on Sep. 20, 2010, 14 pages.".

International Search Report and Written Opinion for Application No. PCT/US2013/068807, mailed on Mar. 19, 2014, 10 Pages.

International Search Report and Written Opinion for Application No. PCT/US2011/020397, mailed on Mar. 11, 2011, 8 pages.

International Search Report and Written Opinion for Application No. PCT/US2013/043462, mailed on Oct. 31, 2013, 7 Pages.

Office Action mailed Jul. 29, 2015 for Korean Application No. 20137017783 filed May 6, 2010, 12 pages.

Clamp-On Weather Proof Rogowski Coil, available at http://www.taehwatrans.com/.

Dielectric Constants of Various Materials Table, http://www.csgnetwork.com/dieconstantstable.html.

* cited by examiner

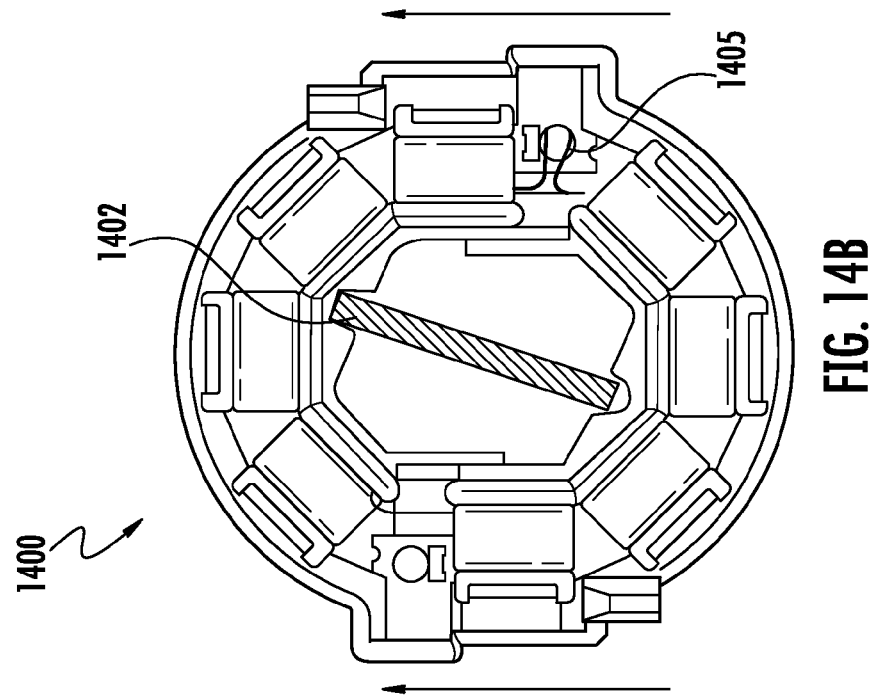
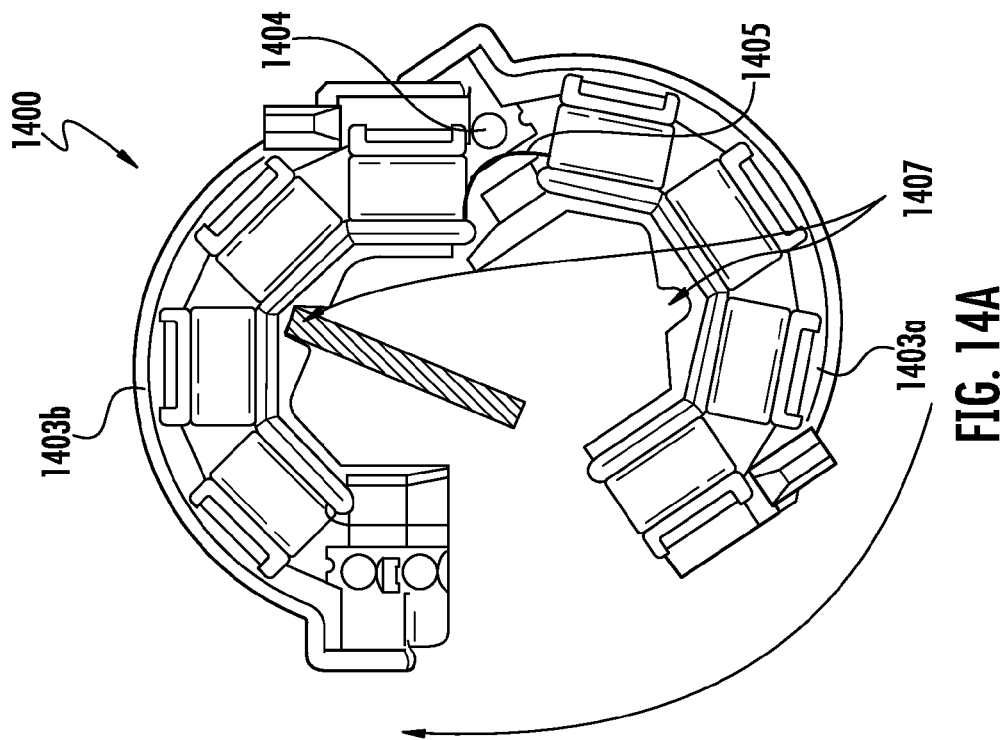
FIG. 14A
FIG. 14B

CURRENT SENSING DEVICES AND METHODS

PRIORITY AND RELATED APPLICATIONS

This application claims priority to and co-owned U.S. Provisional Patent Application Ser. No. 61/653,655 filed May 31, 2012 of the same title, which is incorporated herein by reference in its entirety.

This application is also related to U.S. patent application Ser. No. 12/954,546 filed Nov. 24, 2010 of the same title, which is a continuation-in-part of and claims priority to U.S. patent application Ser. No. 12/684,056 filed Jan. 7, 2010 of the same title, which is a continuation-in-part of and claims priority to U.S. patent application Ser. No. 12/567,622 filed Sep. 25, 2009 of the same title, which claims priority to U.S. Provisional Patent Application Ser. No. 61/230,474 filed Jul. 31, 2009 of the same title, each of which is incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNOLOGICAL FIELD

The present disclosure relates generally to circuit elements and more particularly in one exemplary aspect to devices for the sensing of current, and methods of utilizing and manufacturing the same.

DESCRIPTION OF RELATED TECHNOLOGY

A myriad of different configurations of current sensing devices are known in the prior art. One common approach to the manufacture of current sensing devices is via the use of a so-called "Rogowski coil". A Rogowski coil is an electrical device for measuring alternating current ("AC"). It typically consists of a helical coil of wire with the lead from one end returning through the center of the coil and passing through the helical coil of wire to the other end. The whole helical coil of wire is then positioned around an alternate current carrying conductor whose current is to be measured. The voltage that is induced in the coil is proportional to the rate of change of current in the conductor such that the output of the Rogowski coil is indicative to the amount of current passing through the conductor.

Rogowski coils can be made open-ended and flexible, allowing it to be wrapped around a current carrying conductor without otherwise directly disturbing the current passing through that conductor. A Rogowski coil typically utilizes air, rather than a magnetically permeable core therefore giving the Rogowski coil the properties of possessing both a relatively low inductance along with response to relatively fast-changing currents. Furthermore, the output of a Rogowski coil is typically highly linear, even when subjected to large currents such as those used in electric power transmission, welding, or other pulsed power applications. In addition, properly constructed Rogowski coils are often also largely immune to electromagnetic interference, thereby making them resistant to outside tampering.

Numerous methodologies exist for producing Rogowski coils in the prior art, including for example, those disclosed in U.S. Pat. No. 4,616,176 to Mercure, et al. issued Oct. 7, 1986 and entitled "Dynamic current transducer"; U.S. Pat. No. 5,414,400 to Gris, et al. issued May 9, 1995 and entitled "Rogowski coil"; U.S. Pat. No. 5,442,280 to Baudart issued Aug. 15, 1995 and entitled "Device for measuring an electrical current in a conductor using a Rogowski coil"; U.S. Pat. No. 5,982,265 to Von Skarczinski, et al. issued Nov. 9, 1999 and entitled "Current-detection coil for a current transformer"; U.S. Pat. No. 6,094,044 to Kustera, et al. issued Jul. 25, 2000 and entitled "AC current sensor having high accuracy and large bandwidth"; U.S. Pat. No. 6,313,623 to Kojovic, et al. issued Nov. 6, 2001 and entitled "High precision Rogowski coil"; U.S. Pat. No. 6,614,218 to Ray issued Sep. 2, 2003 and entitled "Current measuring device"; U.S. Pat. No. 6,731,193 to Meier, et al. issued May 4, 2004 and entitled "Printed circuit board-based current sensor"; U.S. Pat. No. 6,822,547 to Saito, et al. issued Nov. 23, 2004 and entitled "Current transformer"; U.S. Pat. No. 7,227,441 to Skendzic, et al. issued Jun. 5, 2007 and entitled "Precision Rogowski coil and method for manufacturing same"; U.S. Pat. No. 7,253,603 to Kovanko, et al. issued Aug. 7, 2007 and entitled "Current sensor arrangement"; U.S. Pat. No. 7,538,541 to Kojovic issued May 26, 2009 and entitled "Split Rogowski coil current measuring device and methods"; United States Patent Pub. No. 20050248430 to Dupraz, et al. published Nov. 10, 2005 and entitled "Current transformer with Rogowski type windings comprising an association of partial circuits forming a complete circuit"; United States Patent Pub. No. 20060220774 to Skendzic published Oct. 5, 2006 and entitled "Precision printed circuit board based Rogowski coil and method for manufacturing same"; United States Patent Pub. No. 20070290695 to Mahon published Dec. 20, 2007 and entitled "Method and Apparatus for Measuring Current"; United States Patent Pub. No. 20080007249 to Wilkerson; et al. published Jan. 10, 2008 and entitled "Precision, Temperature-compensated, shielded current measurement device"; United States Patent Pub. No. 20080079418 to Rea; et al. published Apr. 3, 2008 and entitled "High-precision Rogowski current transformer"; United States Patent Pub. No. 20080106253 to Kojovic published May 8, 2008 and entitled "Shielded Rogowski coil assembly and methods"; and United States Patent Pub. No. 20080211484 to Howell; et al. published Sep. 4, 2008 and entitled "Flexible current transformer assembly".

Despite the broad variety of current sensing technologies set forth above, none achieve the desired level of accuracy and repeatability (e.g., across two different units) while preserving cost efficiency in manufacturing. Specifically with regard to Rogowski coils, prior art attempts at manufacturing such coils have been labor intensive and expensive due largely to the relatively complex winding configurations involved. Moreover, such prior art approaches lack flexibility and configurability; typically, a given coil must be designed and built for a single intended application, and no alteration or adjustment of the parameters of the device can easily be made, in effect dictating replacement or redesign for a different application. Moreover, consistently achieving a very high level of sensitivity of such devices has been elusive.

Multi-Phase Distribution Systems

Polyphase (e.g., three-phase) electric power is a common method of alternating-current electric power generation, transmission, and distribution. It is the most common method used by distribution systems to transfer power, and is also commonly used to power large motors and other heavy loads. A three-phase system is generally more economical than others in that, inter alia, it uses less conductor material to transmit electric power than equivalent single-phase or two-phase systems at the same voltage.

In a three-phase system, three circuit conductors carry three respective alternating currents (of the same frequency; e.g., 60 Hz), which are shifted in phase by 120 degrees so that they reach their instantaneous peak values at different times. Taking one conductor as the reference, the other two currents are delayed in time by one-third (120 degrees) and two-thirds (240 degrees) of one cycle of the electric current. This delay between phases provides effectively constant power transfer over each cycle of the current, and also makes it possible to produce a rotating magnetic field in e.g., the stator of an electric motor or the like. Three-phase systems produce a magnetic field that rotates in a specified direction without having to physically move any conductors, which simplifies the design of electric motors.

Three-phase systems may also have a neutral wire, which allows the three-phase system to use a higher voltage while still supporting lower-voltage single-phase appliances. In high-voltage distribution situations, it is common not to have a neutral wire, as the loads can simply be connected between phases (phase-phase connection).

The three phases of such systems may be connected in generally one of two ways: (i) so-called "wye", wherein the phases form the shape of a Y by virtue of the phases being connected to each other at a central node, or (ii) so-called "delta", where the three phases form a triangle or Greek delta symbol by virtue of being connected to their neighboring phases at their ends.

Three-phase has a number of desirable properties, including that the phase currents tend to cancel out one another, summing to zero in the case of a linear balanced load. This allows the elimination or reduction in the size of the neutral conductor; each of the phase conductors carry effectively the same current, and hence can be the same size (for a balanced load). Moreover, power transfer into a linear balanced load is constant, which aids in reducing reduce generator and motor vibrations which can be deleterious to device longevity, create unwanted noise or harmonics, etc.

Due to its pervasive use in industry and other applications, accurate, consistent, and cost-efficient sensing of current in three-phase systems is also of great interest (in addition to single-phase systems such as those broadly used in residential or similar applications).

Hence, there is a salient need for current sensing devices (including Rogowski coils) that both are low in cost to manufacture, such low cost being enabled by inter alia addressing the difficulties associated with the complex coil configurations of prior art current sensing devices, and offer improved or at least comparable electrical performance and sensitivity as compared to prior art devices.

SUMMARY OF THE DISCLOSURE

The foregoing needs are satisfied by the present disclosure, which provides inter alia, apparatus and methods for current sensing in electrical systems, including for instance single phase alternating current (AC) systems, and polyphase apparatus such as three-phase AC distribution systems.

In a first aspect of the disclosure, a current sensing inductive device is disclosed. In one embodiment, the device includes a plurality of coil-like sensing elements, at least one of the sensing elements having a configuration different than that of each of the remainder of the plurality of elements. In one variant, the at least one sensing element having the different configuration is configured to be disposed relative to a sensed structure such that one or more electrical attributes of the current sensing inductive device are enhanced.

In another embodiment of the sensing device, a desired placement and orientation of a bus bar within the sensor is provided for. In one such variant, the bus bar has a substantially rectangular cross-section, and the apparatus includes a housing which accepts the bus bar in only one position (or its inverse), thereby assuring proper placement of the sensor with respect to the bus bar for, inter alia, maximum sensitivity and accuracy.

In yet another embodiment of the sensing apparatus, a plurality of non-symmetric segment windings are utilized in the bobbin/winding arrangement, such that the overall shape of the sensing apparatus is non-symmetric in at least one aspect. This asymmetry can be used to, inter alia, (i) account for bus bar profiles which would otherwise cause the sensing apparatus to have a larger total size; and/or (ii) account for variations in magnetic field density around the bus bar(s) such that greater sensing apparatus current sensitivity or immunity to external magnetic fields is provided.

In still another embodiment, a non-symmetrical coil area is utilized. For example, in one implementation, the number of winding turns is varied.

In yet another embodiment, a non-symmetrical bobbin area is utilized.

In a further embodiment, a non-symmetrical bobbin length and/or shape is utilized.

In yet another embodiment, a non-symmetrical coil arrangement and/or combination of coils is utilized.

In a second aspect of the disclosure, a system apparatus that incorporates the aforementioned current sensing inductive devices is disclosed. In one variant, the system comprises a three-phase system having three bus bars.

In a third aspect of the disclosure, methods of manufacturing the aforementioned device(s) are disclosed.

In a fourth aspect of the disclosure, methods of using the aforementioned apparatus are disclosed.

In a fifth aspect of the disclosure, a scalable inductive device is disclosed.

In a sixth aspect of the disclosure, a low cost and highly precise inductive device is disclosed.

In an seventh aspect of the disclosure, a bus bar receiving insert or component is disclosed. In one embodiment, the insert or component cooperates with a housing element to keep a bus bar in a desired orientation relative to e.g., a plurality of current sensing coils.

In an eighth aspect of the disclosure, a support structure or housing for use with the aforementioned current sensing inductive devices is disclosed.

In a ninth aspect of the disclosure, a bobbin element for use in the aforementioned current sensing inductive devices is disclosed.

In a tenth aspect of the disclosure, a method of disposing a current sensing apparatus on a bus bar is disclosed. In one embodiment, the method includes disposing a portion of a separable sensing coil apparatus on a base, disposing the bus bar atop the disposed portion, and then wrapping the remainder of the sensing coil apparatus around the bus bar so as to form a substantially complete loop around the bus bar.

In an eleventh aspect of the disclosure, a separable loop sensing coil apparatus, and methods of use thereof, are disclosed. In one embodiment, the apparatus includes a base element and a plurality of rotatably coupled coils sensing segments.

BRIEF DESCRIPTION OF THE DRAWINGS

The features, objectives, and advantages of the disclosure will become more apparent from the detailed description set forth below when taken in conjunction with the drawings, wherein:

FIGS. 14A and 14B are top elevation cross-sectional views of yet another embodiment of a clamp-on type sensing apparatus according to the disclosure, shown in the open position (FIG. 14A) and the closed or clamped position (FIG. 14B).

Figure 1:
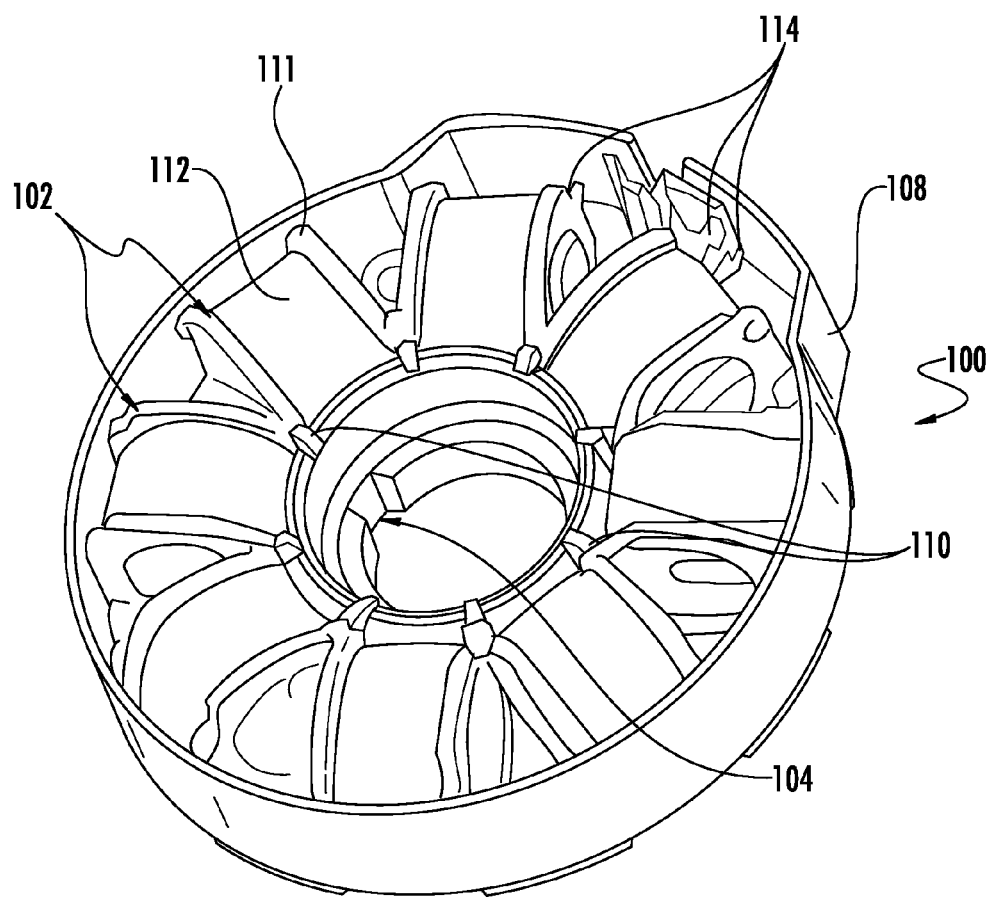
FIG. 1 is a top perspective view of one embodiment of a fixed radial bobbin array (cover removed) with internal features to control the location of the bus bar and align it with the gap between bobbins.

All Figures disclosed herein are ©Copyright 2012 Pulse Electronics, Inc. All rights reserved.

DETAILED DESCRIPTION OF THE PREFERRED EMBODIMENT

Reference is now made to the drawings wherein like numerals refer to like parts throughout.

As used herein, the terms "bus" and "bus" bar intended to broadly apply to any sensed component(s) (e.g., conductor or plurality of conductors) in an electrical system, regardless of shape or disposition.

As used herein, the terms "bobbin" and "form" (or "former") are used without limitation to refer to any structure or component(s) disposed on or within or as part of an inductive device which helps form or maintain one or more windings of the device. As used herein, the terms "electrical component" and "electronic component" are used interchangeably and refer to components adapted to provide some electrical and/or signal conditioning function, including without limitation inductive reactors ("choke coils"), transformers, filters, transistors, gapped core toroids, inductors (coupled or otherwise), capacitors, resistors, operational amplifiers, and diodes, whether discrete components or integrated circuits, whether alone or in combination.

As used herein, the term "inductive device" refers to any device using or implementing induction including, without limitation, inductors, transformers, and inductive reactors (or "choke coils".

As used herein, the terms "network" and "bearer network" refer generally to any type of data, telecommunications or other network including, without limitation, data networks (including MANs, PANs, WANs, LANs, WLANs, micronets, piconets, internets, and intranets), hybrid fiber coax (HFC) networks, satellite networks, cellular networks, and telco networks. Such networks or portions thereof may utilize any one or more different topologies (e.g., ring, bus, star, loop, etc.), transmission media (e.g., wired/RF cable, RF wireless, millimeter wave, optical, etc.) and/or communications or networking protocols (e.g., SONET, DOCSIS, IEEE Std. 802.3, 802.11, ATM, X.25, Frame Relay, 3GPP, 3GPP2, WAP, SIP, UDP, FTP, RTP/RTCP, H.323, etc.).

As used herein, the terms "network interface" or "interface" typically refer to any signal, data, or software interface with a component, network or process including, without limitation, those of the FireWire (e.g., FW400, FW800, etc.), USB (e.g., USB2, USB 3.0, USB On-the-Go, etc.), Ethernet (e.g., 10/100, 10/100/1000 (Gigabit Ethernet), 10-Gig-E, etc.), MoCA, optical (e.g., PON, DWDM, etc.), Serial ATA (e.g., SATA, e-SATA, SATAII), Ultra-ATA/DMA, Coaxsys (e.g., TVnet™), radio frequency tuner (e.g., in-band or OOB, cable modem, etc.), WiFi (802.11a,b,g,n), WiMAX (802.16), PAN (802.15), IrDA, or other wireless families.

As used herein, the term "signal conditioning" or "conditioning" shall be understood to include, but not be limited to, signal voltage transformation, filtering and noise mitigation, signal splitting, impedance control and correction, current limiting, capacitance control, and time delay.

As used herein, the terms "top", "bottom", "side", "up", "down", "upper", "lower" and the like merely connote a relative position or geometry of one component to another, and in no way connote an absolute frame of reference or any required orientation. For example, a "top" portion of a component may actually reside below a "bottom" portion when the component is mounted to another device (e.g., to the underside of a PCB).

Overview

The present disclosure provides, inter alia, improved low cost current sensing apparatus and methods for manufacturing and utilizing the same.

Co-owned and co-pending U.S. patent application Ser. No. 12/954,546 filed Nov. 24, 2010 entitled "CURRENT SENSING DEVICES AND METHODS, as well as related U.S. patent application Ser. No. 12/684,056 filed Jan. 7, 2010 of the same title, and U.S. patent application Ser. No. 12/567,622 filed Sep. 25, 2009 of the same title, each previously incorporated herein, describe a variety of apparatus and methods relating to current sensing coils, including those utilizing the aforementioned Rogowski principles.

The present disclosure discloses yet additional variants and embodiments of the foregoing apparatus and methods, particularly adapted to further exploit desirable or required features of the general Rogowski sensing architecture including, inter alia: (i) placement of the sensing apparatus in a desired orientation relative to a sensed apparatus (e.g., a bus bar), so as to optimize current sensing performance; (ii) use of asymmetric geometries to accommodate design features and enhance performance; (iii) optimization of the sensing apparatus for polyphase (e.g., three-phase AC) applications; and (iv) the ability to add, adjust/reconfigure, and/or remove a current sensing apparatus, to/from a bus bar with ends which are inaccessible (i.e., which is installed in an operational system).

In exemplary implementations, the improved devices disclosed herein not only offer very low manufacturing cost and improved electrical performance (including sensitivity), but also provide a high level of consistency and reliability of performance.

Moreover, the exemplary devices herein are at least somewhat scalable, spatially compact, and able to assume various desired form factors, as well as accounting for various physical phenomena and/or asymmetries in e.g., magnetic fields generated by sensed equipment such as multi-phase electrical equipment, as well as different bus bar shapes and orientations.

Detailed Description of Exemplary Embodiments

Detailed descriptions of the various embodiments and variants of the apparatus and methods of the disclosure are now provided. While primarily discussed in the context of current sensing devices, and in particular in one embodiment to current sensing devices that operate according to the Rogowski principle, the various apparatus and methodologies discussed herein are not so limited. In fact, many of the apparatus and methodologies described herein are useful in the manufacture of any number of complex coil configurations (such as wound torus shapes) that can benefit from the segmented manufacturing methodologies and apparatus described herein, including devices that do not utilize or need a pass through or return conductor.

In addition, it is further appreciated that certain features discussed with respect to specific embodiments can, in many instances, be readily adapted for use in one or more other contemplated embodiments that are described herein (as well as those set forth in the previously incorporated references).

It would also be readily appreciated by one of ordinary skill, given the present disclosure that many of the features described herein possess broader usefulness outside of the specific examples and implementations with which they are described.

Rogowski Coil Principles—

In order to better understand various design considerations in implementing the methodologies for the manufacture of exemplary coils as described subsequently herein, it is useful to understand the underlying principles that govern the behavior of a Rogowski-type coil. As is well understood in the electronic arts, the voltage produced by a Rogowski coil is driven by Equation (1) below:

$$V = \frac{-AN\mu_0}{l} \frac{dI}{dt} \qquad \text{Equation (1)}$$

Where:
  A=the area of one of the small loops;
  N=the number of turns;
  I=is the length of the winding;
  $\mu_o$=a magnetic constant; and
  dI/dt=is the rate of change of the current in the loop.

In order for a real-life implementation to operate closer to the theoretical behavior set forth in Equation (1), various assumptions are made including that the turns are evenly spaced, and that the radius of the device is comparatively large as compared with the radius of the turns themselves. Accordingly, these assumptions and how they affect the sensitivity of the Rogowski coil itself should be kept in mind in the subsequent discussion of various coil devices as set forth below.

Bus Positioning Embodiments—

Referring now to FIGS. 1-9C, in a first aspect of the disclosure, various embodiments of current sensing apparatus are disclosed that maintain a bus bar (e.g., one with a rectangular or other prescribed cross-section) in a desired orientation relative to the sensing device.

Figure 5:
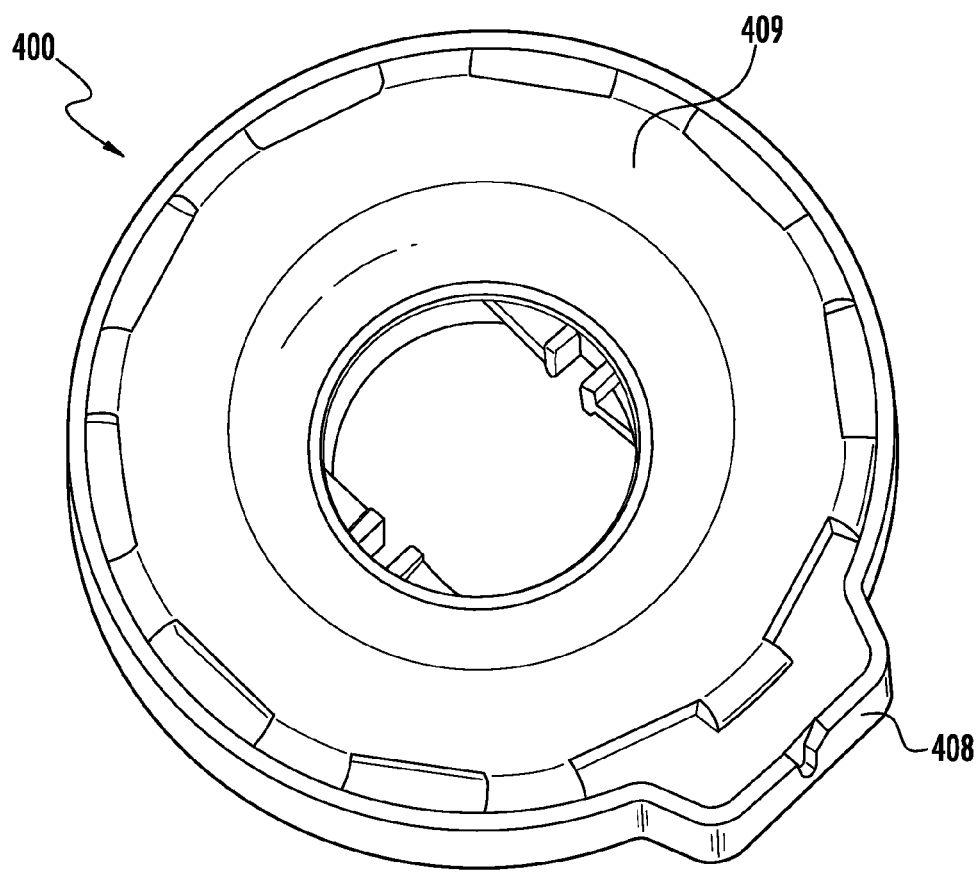
FIG. 5 is a top perspective view of the apparatus of FIG. 4, with top cover installed.

In one embodiment shown in FIG. 1, an even number of sensing coil elements 102 (e.g., 8), each comprised of a bobbin 111 and sensing coil 112 disposed thereon, is utilized within the apparatus 100, and the bus bar 202 (FIG. 2) is retained within the apparatus at its ends 206 by two bus bar retaining recesses 104 formed within the apparatus molded housing 108 so that the bus bar lies in a plane 106 that bisects the apparatus in two equal halves (here, centered on the interface 110 of two coil elements 102a, 102b, although it will be appreciated that the aforementioned plane may be centered on two sensing elements 102 themselves, such as in the embodiment of FIG. 5 discussed infra).

In another variant, an odd number of sensing elements (e.g., 7 or 9) is used in the apparatus, and the bus bar is situated in an orientation so as to provide the best performance characteristics, such as may be determined by modeling, or actual in situ or laboratory testing.

Figure 2:
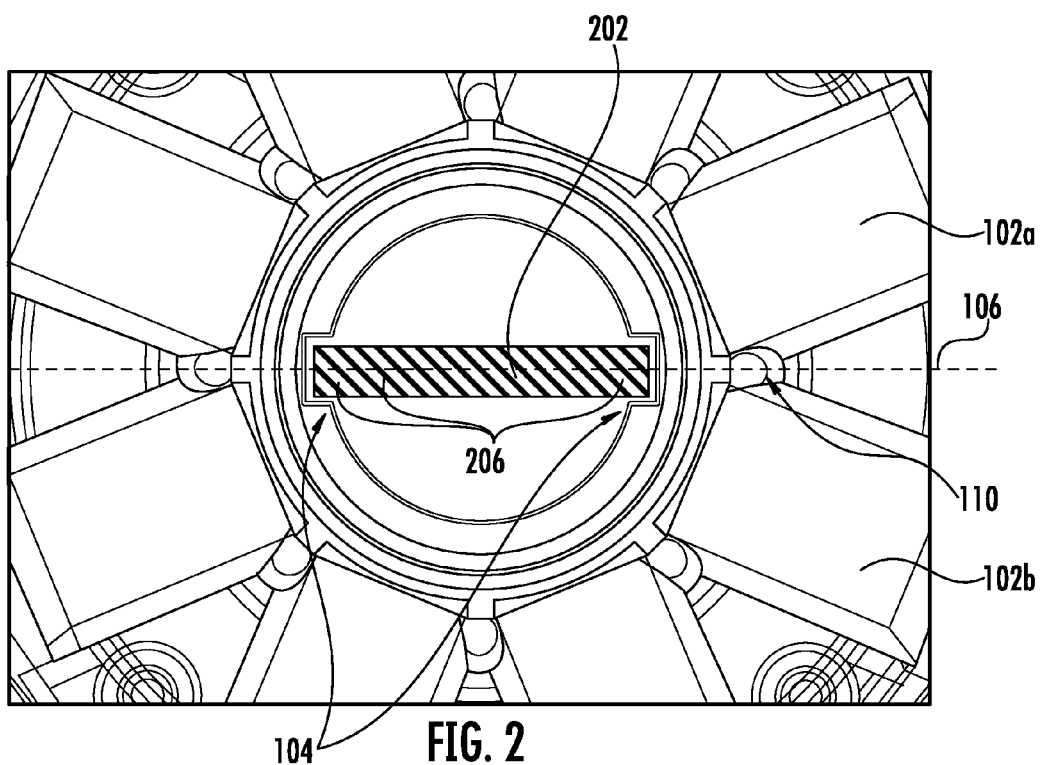
FIG. 2 is a top elevation view of the apparatus of FIG. 1, showing a detail of the internal features to control the location/disposition of the bus bar.

It is noted that in the embodiment of FIGS. 1-2, the fixed design (i.e., unbroken housing 108) requires the bus bar to be inserted through the center during assembly.

Figure 3:
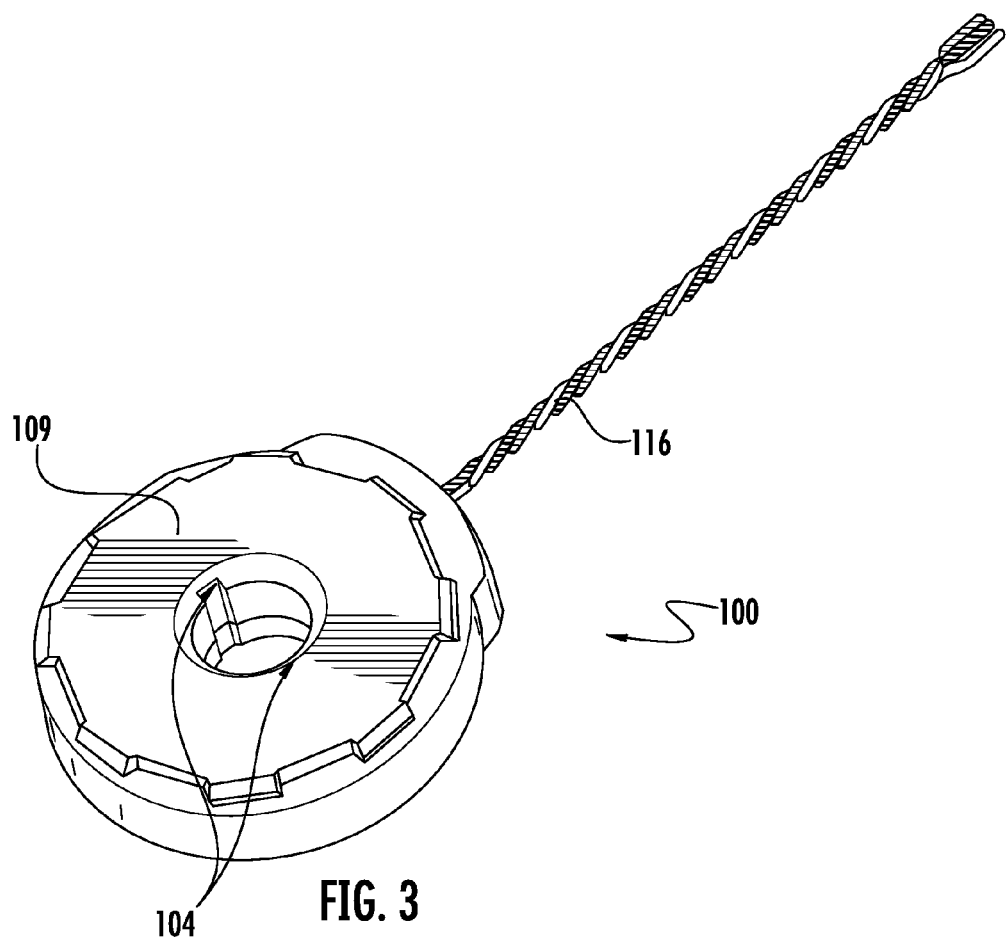
FIG. 3 is a top perspective view of the apparatus of FIG. 1, with cover and three (3) wire leads as assembled.

FIG. 3 is a top perspective view of the apparatus of FIGS. 1-2, with cover 109 and three (3) wire leads 116 (which are connected to the terminals 114 of FIG. 1) as assembled.

Figure 4:
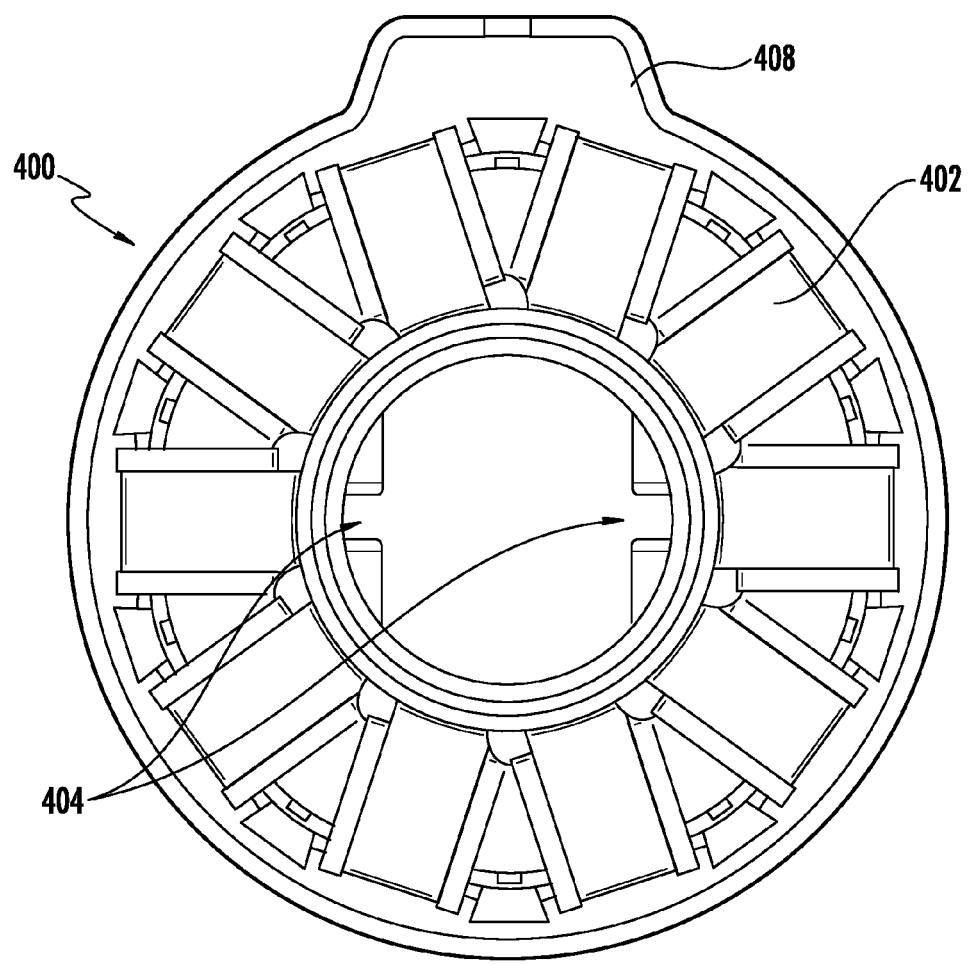
FIG. 4 shows a fixed ten (10) radial bobbin sensing apparatus with center features to maintain the position of the bus bar in relation to the wound bobbin configuration.

FIGS. 4 and 5 show a fixed radial bobbin sensing apparatus 400 having ten (10) sensing elements 402 with center features 404 formed within the housing 408 to maintain the position of the bus bar 202 in relation to the wound bobbin array configuration. FIG. 5 shows the apparatus 400 with cover 409 installed. Use of the ten (10) elements in this embodiment allows for, inter alia, a smaller or larger inside diameter to accommodate different size center conductors.

Figure 6A:
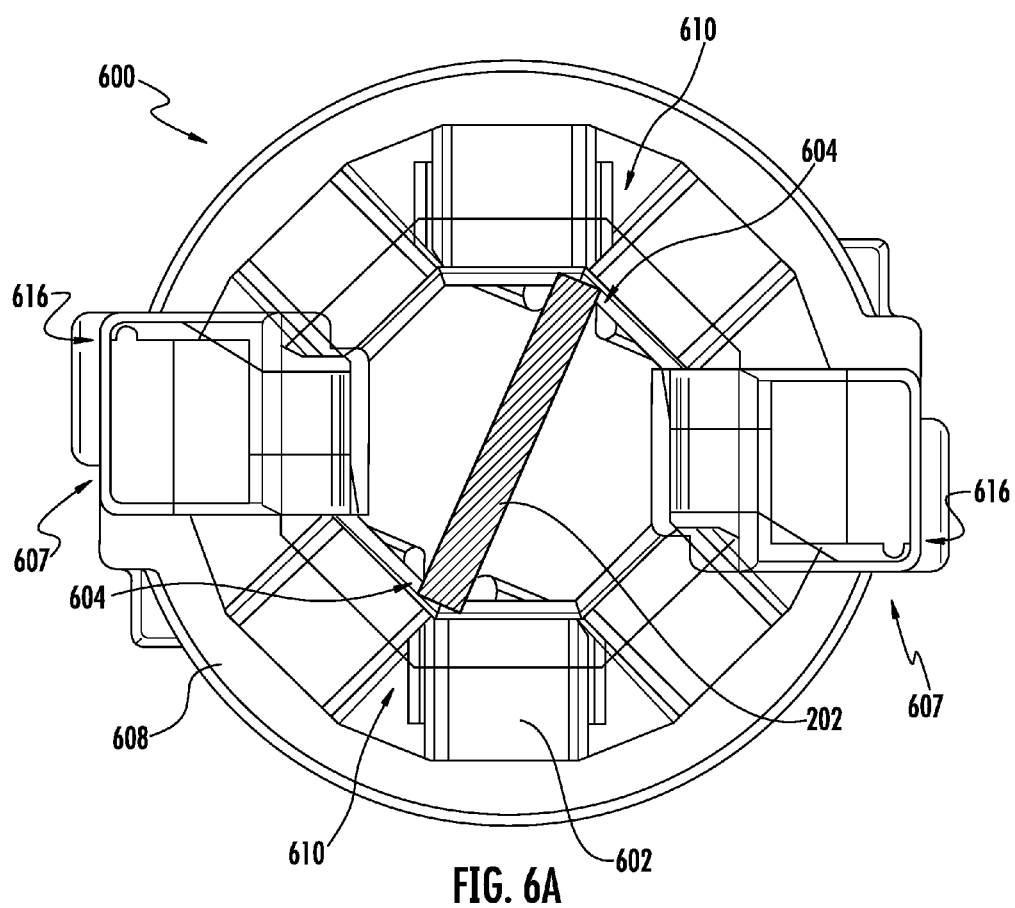
FIGS. 6A and 6B are front elevation views (partially transparent) of first and second embodiments, respectively of "clamp-on" radial bobbin array sensing apparatus.
Figure 6B:
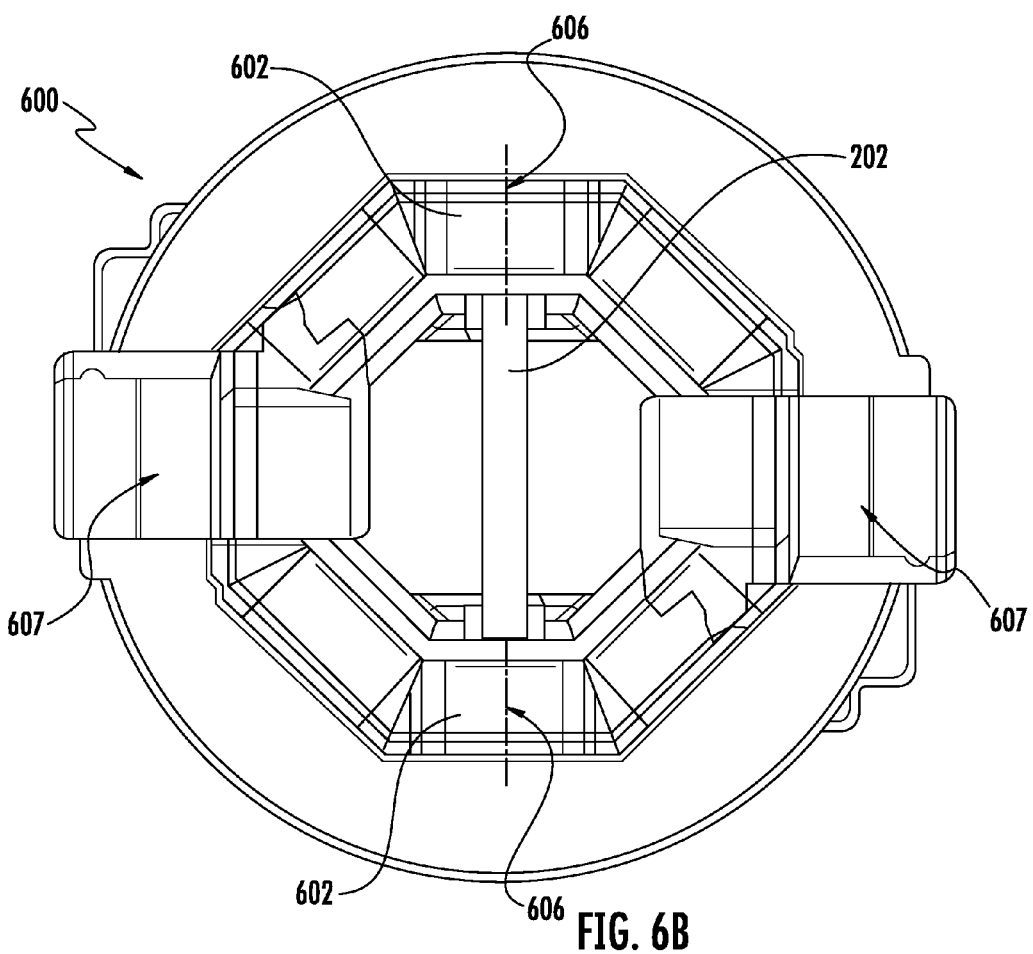

FIGS. 6A and 6B are front elevation views of exemplary embodiments of "clamp-on" radial bobbin sensing apparatus 600 (eight (8) sensing elements in each configuration) that show the bus bar 202 in respective ones of two orientations; i.e., (i) disposed within a plane that intersects the intersections 610 of adjacent sensing elements 602 (FIG. 6A), and (ii) disposed within a plane that intersects two sensing elements at their midpoint 606 (FIG. 6B). While the two exemplary dispositions are illustrated, it will be appreciated that literally any relative angle may be used consistent with the disclosure, and/or a different number (or geometry) of sensing elements may be used as well.

The housing 608 of the apparatus 600 is in both variants (i), (ii) configured such that it is separable at two seams 616 via two "snap" or other joints 607, the joints disposed at e.g., roughly 180-degrees from each other on the apparatus. In this fashion, the apparatus 600 is separable into two pieces so as to facilitate addition to an installed bus bar, or removal therefrom. Various configurations of joints (such as for instance those described with respect to FIGS. 12A-14B infra, or yet others that will be appreciated by those of ordinary skill when given the present disclosure) may be used depending on the desired functionality and bus bar configuration.

The clamp-on concept of FIGS. 6A and 6B (and other configurations described infra) allows the sensing apparatus (and hence bobbin array) to be temporarily separated at one or more of the junctions between the bobbins, so that the assembly can slide over the bus bar and be rejoined back together in the required alignment (i.e., as dictated by the bus bar receiving apertures 604). Specifically, such embodiments address, inter alia, the need to be able to add or remove the sensing device (such as for initial installation, maintenance/sensing element replacement or upgrade, removal before system demolition, etc.).

Figure 7:
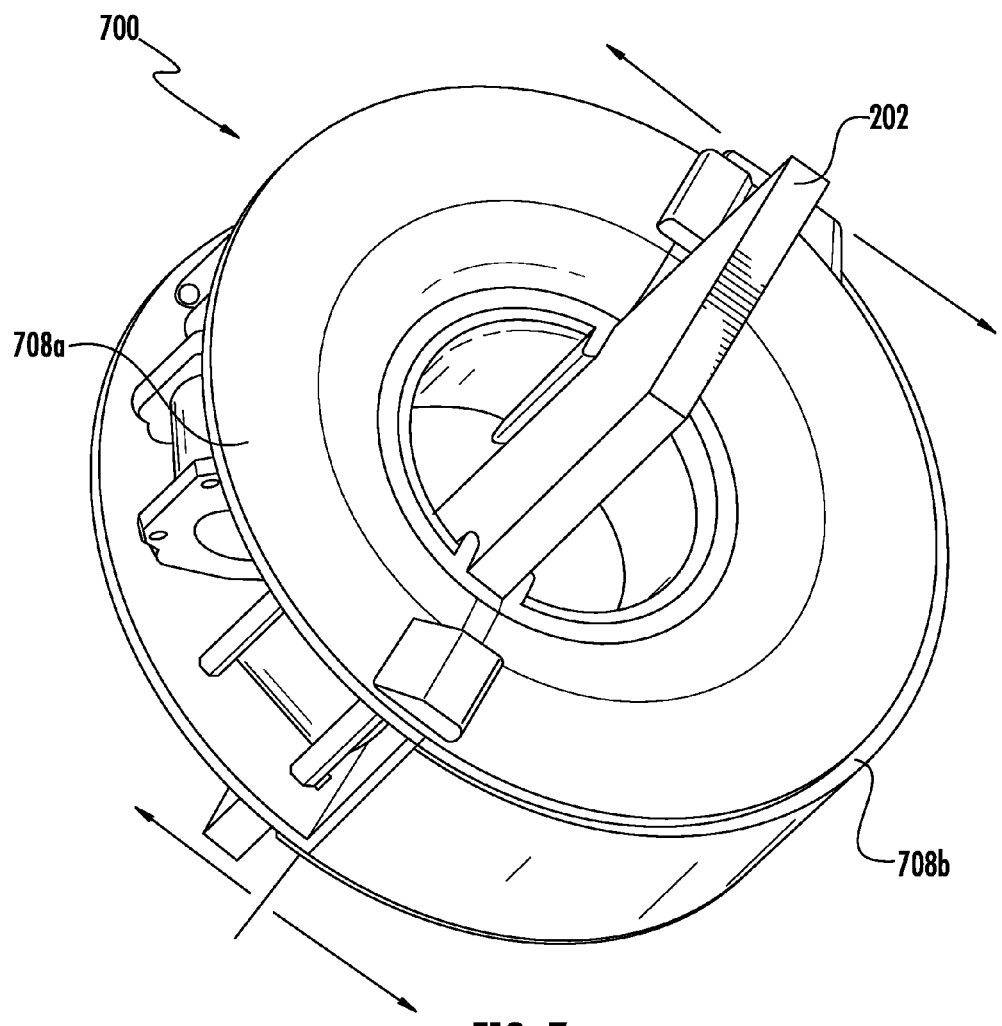
FIG. 7 is a perspective view of yet another embodiment of a clamp-on radial bobbin array sensing apparatus that controls the location of the bus bar relative to the wound bobbins.

FIG. 7 illustrates yet another "clamp-on" configuration of a radial sensing apparatus 700 with bobbin array that controls the location of the bus bar relative to the wound bobbins. In the illustrated configuration, the sensing apparatus 700 is divided into two half-sections 708a, 708b which are hingedly or separably mated with one another such that the apparatus can be clamped onto the bus bar even when the ends of the bus bar are inaccessible. Specifically, the two halves of the sensing apparatus housing 708a, 708b are configured to hold an equal number of sensing elements (although this is not a requirement) such that the bus bar is symmetrically received within the housing when both halves are mated. It will be appreciated, however, that the aforementioned symmetric disposition is also not a requirement of practicing the disclosure; i.e., the apparatus housing may be configured such that the bus bar can be asymmetrically received therein as well, and/or the housing (and/or bobbins) may also be asymmetrically configured, as described elsewhere herein.

Figure 12A:
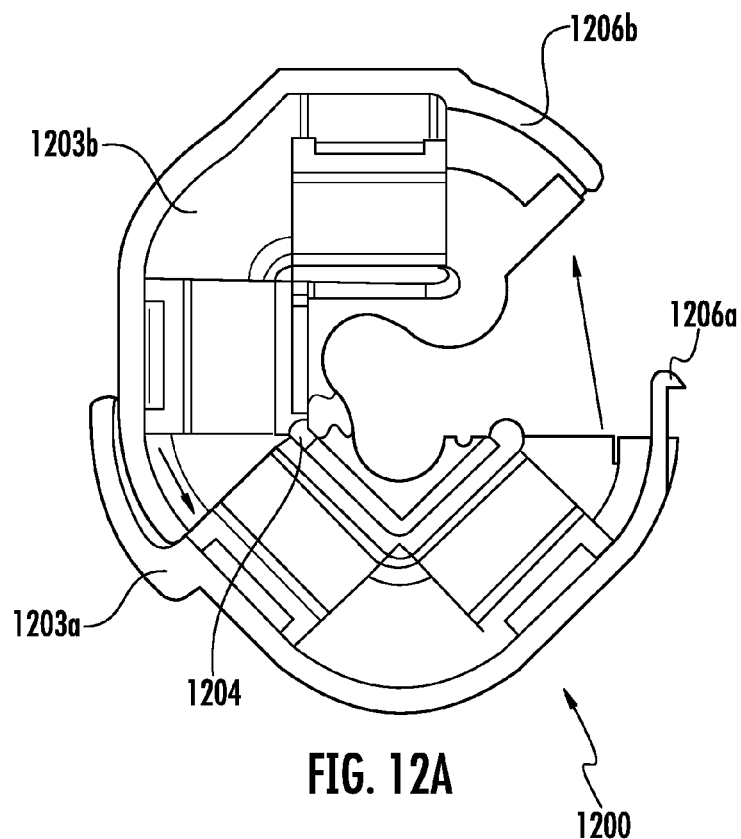
FIGS. 12A and 12B are top elevation views of another embodiment of a clamp-on type sensing apparatus according to the disclosure, shown in the open position, and illustrating (i) a detail of the internal features thereof (cross-sectional view of FIG. 12A), and (ii) unsectioned (FIG. 12B).
Figure 12B:
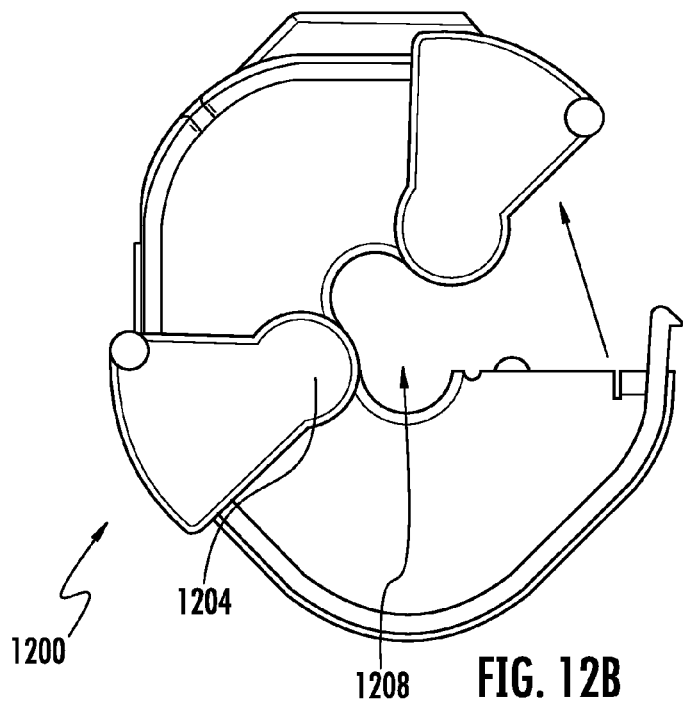

FIGS. 12A and 12B are top elevation views of another embodiment of a clamp-on type sensing apparatus 1200 according to the disclosure, shown in the open position, and illustrating (i) a detail of the internal features thereof (cross-sectional view of FIG. 12A), and (ii) unsectioned (FIG. 12B). As shown, the apparatus utilizes a set of complementary latching mechanisms 1206a, 1206b, and a hinge arrangement 1204 which allows the two portions 1203a, 1203b of the apparatus 1200 to articulate or rotate with respect to one another. In this fashion, a gap is opened up on one side of the apparatus 1200 so that a bus bar or other conductor(s) can be inserted there through.

Figure 13A:
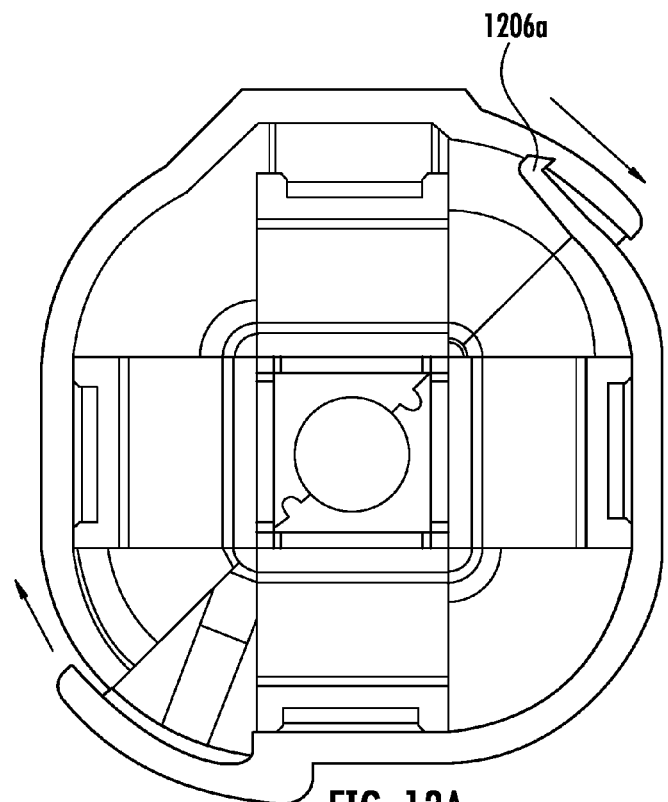
FIGS. 13A and 13B are top elevation views of the clamp-on type sensing apparatus according to FIGS. 12A and 12B, shown in the closed or clamped position.
Figure 13B:
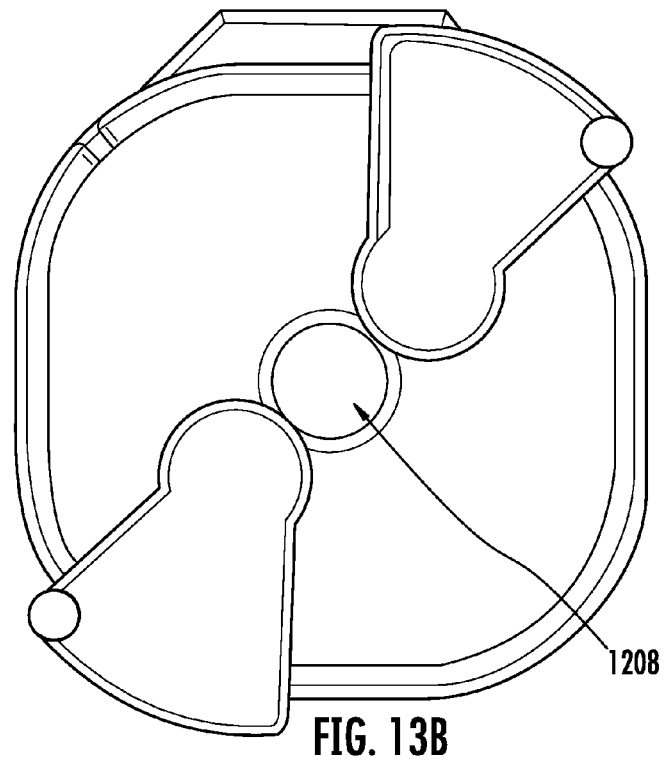

FIGS. 13A and 13B are top elevation views of the apparatus 1200, shown in the closed or clamped position. As illustrated, the complementary locking features 1206a, 1206b mate together so as to secure the two portions 1203a, 1203b together around the conductor(s). It will be appreciated that while the illustrated embodiment of the apparatus 1200 includes a substantially circular central aperture 1205, other shapes (including without limitation those which accommodate rectangular-shaped bus bars) may be used as well.

FIGS. 14A and 14B are top elevation cross-sectional views of yet another embodiment of a clamp-on type sensing apparatus according to the disclosure, shown in the open position (FIG. 14A) and the closed or clamped position (FIG. 14B). As illustrated, this embodiment utilizes a two-step clamping or locking process. Specifically, the two portions 1403a, 1403b of the apparatus 1400 may articulate with respect to one another (including around the hinge 1404), such that a gap opens up on the side of the apparatus 1400 to receive the bus bar(s), similar to the embodiment of FIGS. 12A and 12B. However, an additional degree of freedom is provided, such that the two portions 1403a, 1403b can slide linearly relative to one another (in the direction of the arrows in FIG. 14B) when closed around the bus bar(s), so as to further restrict the bus bar(s) within the central aperture. Moreover, in this embodiment, a rectangular bus bar 1402 is used, and two complementary cutouts or shaped features 1407 so as to receive the edges of the bus bar 1402 and allow the apparatus 1400 to be more spatially compact (and hold the bus bar in a prescribed orientation relative to the apparatus 1400). A wire 1405 is used to electrically bridge the two spool elements adjacent to the hinge 1404 and maintain electrical continuity, in that the two spools are separated from one another when the apparatus is fully opened (i.e., slid open as well as "hinged" open, as shown in FIG. 14A).

Referring now to FIGS. 8A-8H, another embodiment of a current sensing apparatus 800 (and methods of use) is shown and described in detail. In this embodiment, the current sensor apparatus 800 includes a base element 804 formed of e.g., molded plastic and having two apertures 806 configured to receive the U-shaped bus bar 802. One or more mounting elements (e.g., pins) 813 are also optionally provided. A plurality (here four, but other numbers may be utilized) of wound sensor elements 803a-d are hingedly or frangibly coupled 807 to one another, and separated (or separable from) one another in at least one location.

Figure 8A:
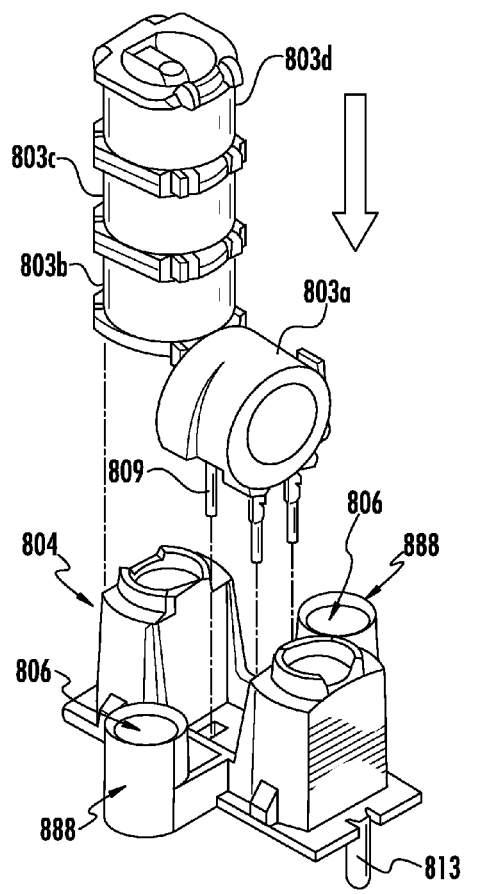
FIGS. 8A-8H are various perspective views of another embodiment of the current sensing apparatus of the disclosure during assembly thereof.
Figure 8B:
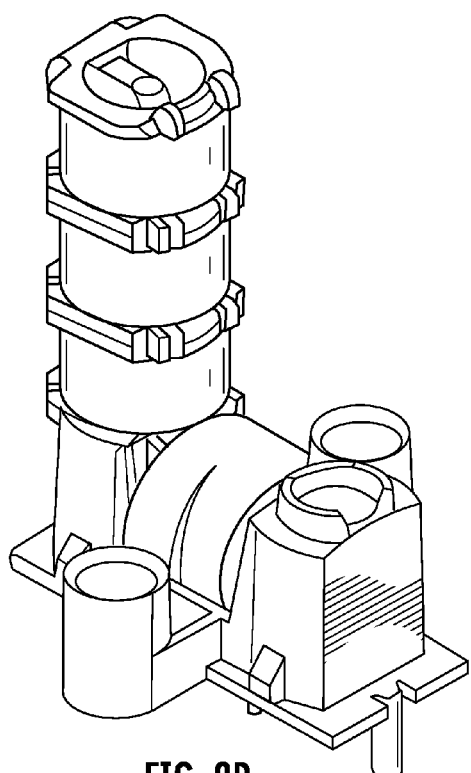

As illustrated in the sequence of FIGS. 8A-8H, the apparatus 800 is placed onto the bus bar 802 by first installing one of the sensing elements 803a onto the base element 804 as shown in FIGS. 8A and 8B. The installed sensing element 803a includes a plurality of terminals 809 (here, pin-like terminals, although other conductor or terminal shapes or approaches can be used, including for example surface mounting or self-leading) which pass through complementary apertures within the base element 804. In one variant, the installed (lower) sensing element bobbin is press fit or frictionally received or snap-fit into the base element for easy installation or removal, but other approaches may be used.

Figures 8C, 8D:
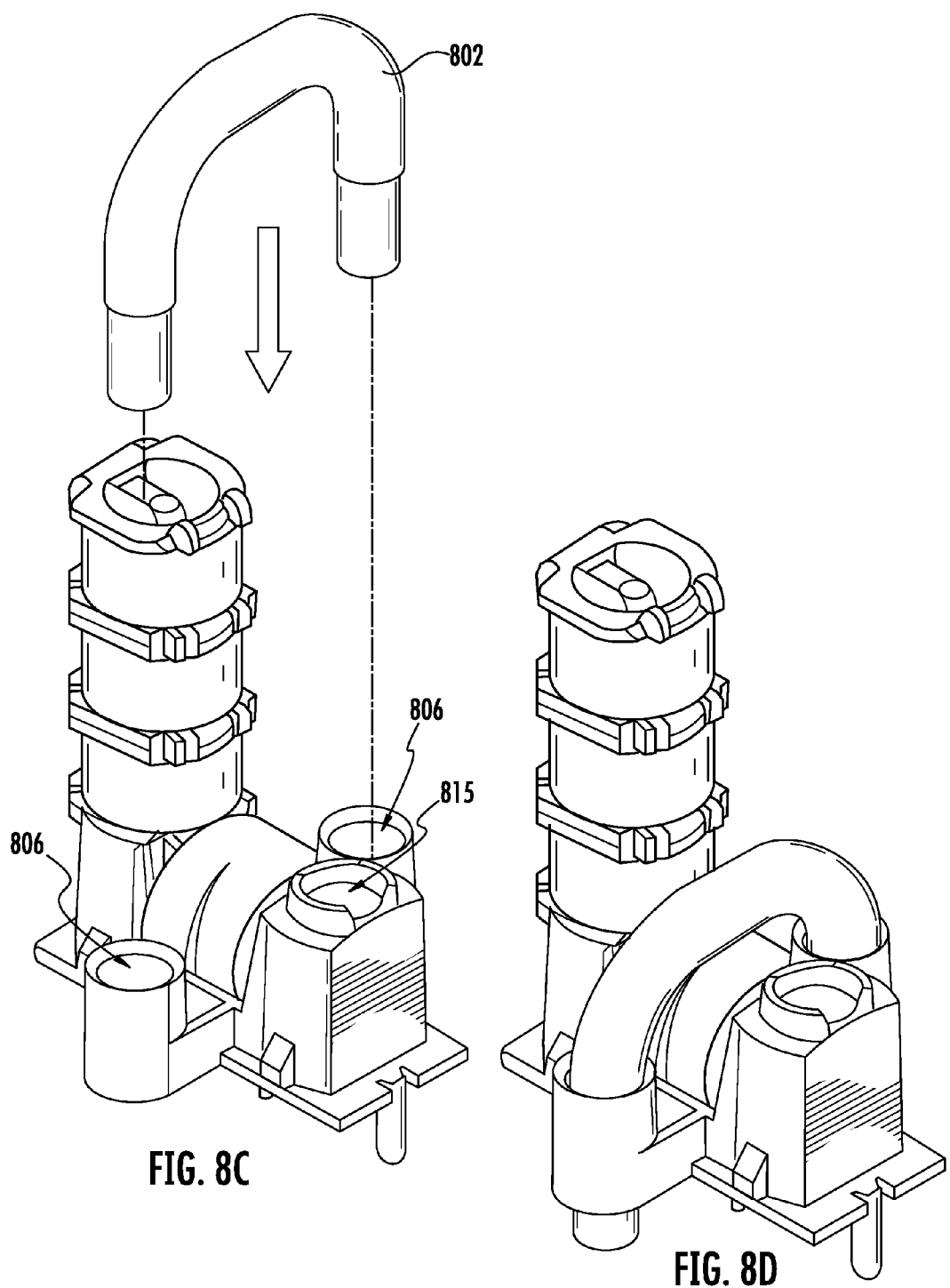

As shown in FIGS. 8C and 8D, once the lower sensing element 803a and bobbin is in place, the bus bar 802 is inserted through its corresponding apertures in the base element 804.

Figure 8E:
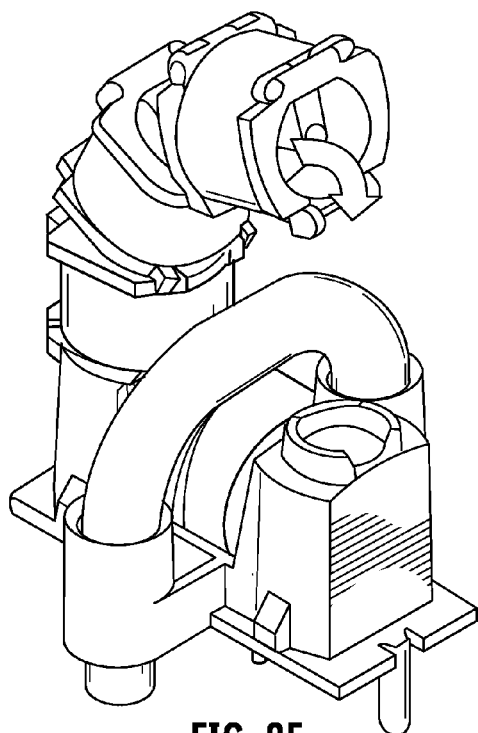
Figure 8F:
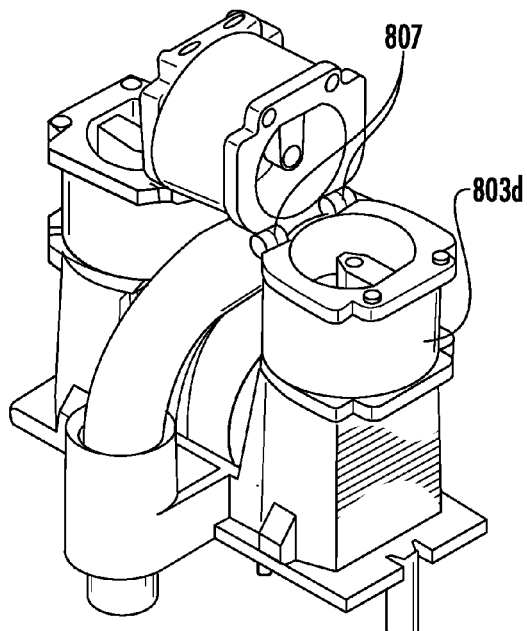

Next, the remaining sensing elements 803b-803d are wrapped around the bus bar 802 using the hinged or frangible couplings, and the two "ends" disposed proximate one another (i.e., such that the end sensing element 803d is received into feature 815 on the base element, such that the four sensing elements 803a-d fully enclose the bus bar 802 (FIGS. 8E and 8F).

Figure 8G:
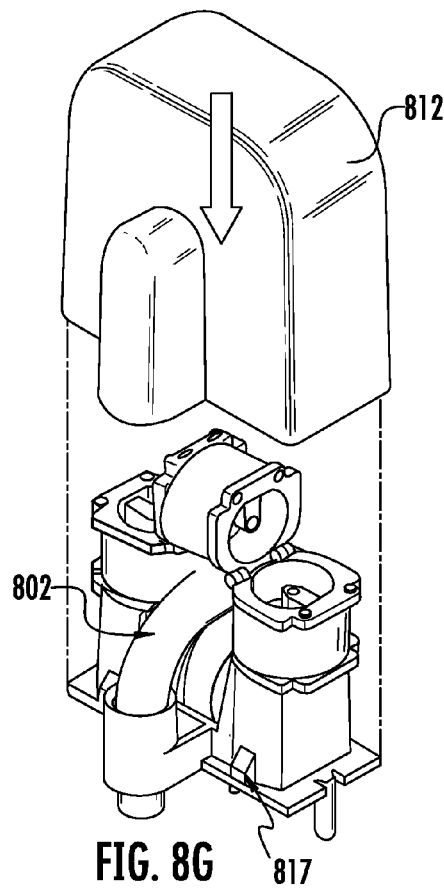
Figure 8H:
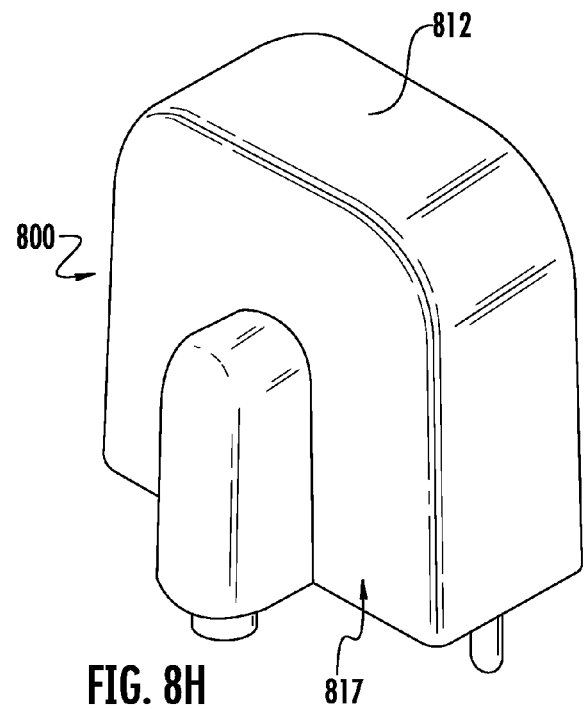

Lastly, in FIGS. 8G and 8H, the optional cover element 812 is applied over the sensing elements, bus bar, and base element, so as to substantially enclose the interior portions of the apparatus 800. The cover (and base element 804) optionally include snap-together latches 817 or similar elements to hold the cover 812 in place on the base 804.

It will be appreciated that the cover 812 (and for that matter the base element 804) may be constructed using electromagnetic/electrostatic shielding materials, such as by having a deposited or plated metallization layer on the interior or exterior surfaces, or a discrete (e.g., tin alloy) shield element disposed thereon (not shown). Such shielding may be used for, inter alia, suppressing externally generated electromagnetic noise or electrostatic charges that may interfere with the operation of the sensing apparatus 800, and/or shielding internally generated electromagnetic noise or electrostatic charges from escaping the apparatus 800 and potentially interfering with nearby equipment, including potentially other proximate sensing apparatus 800.

It will also be appreciated that while the embodiment of FIGS. 8A-8H is shown and described with respect to a base element 804 that requires insertion of the ends of the bus bar 802 therein (see FIGS. 8C-8D), such a configuration is only illustrative, and not a requirement. For example, in another variant (not shown), the base element is configured such that it can be passed at least partly between the parallel portions of the bus bar, so that the apparatus 800 can be installed or removed on bus bars whose ends are not accessible. This can be accomplished in one approach by leaving the side portions 888 of the base element open (e.g., removing the material from the dotted lines outward as shown in FIG. 8A), and/or making the structure of the base element somewhat deformable or resilient such that it can be "snapped" into place between the bus bar parallel portions. Yet other approaches will be recognized by those of ordinary skill given the present disclosure.

Figure 9A:
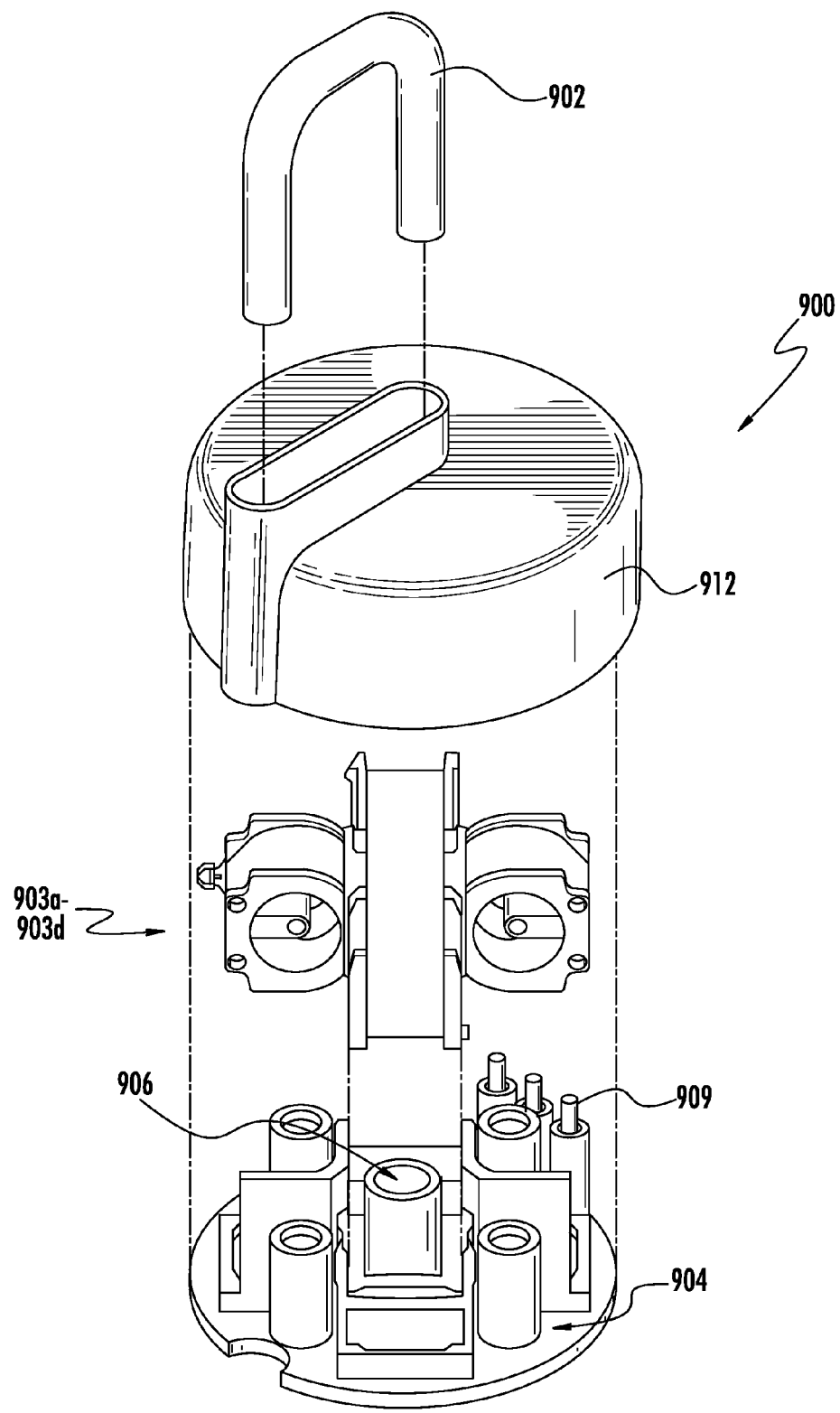
FIGS. 9A-9C are various top and bottom perspective views of yet another embodiment of the current sensing apparatus of the disclosure during assembly thereof.
Figure 9B:
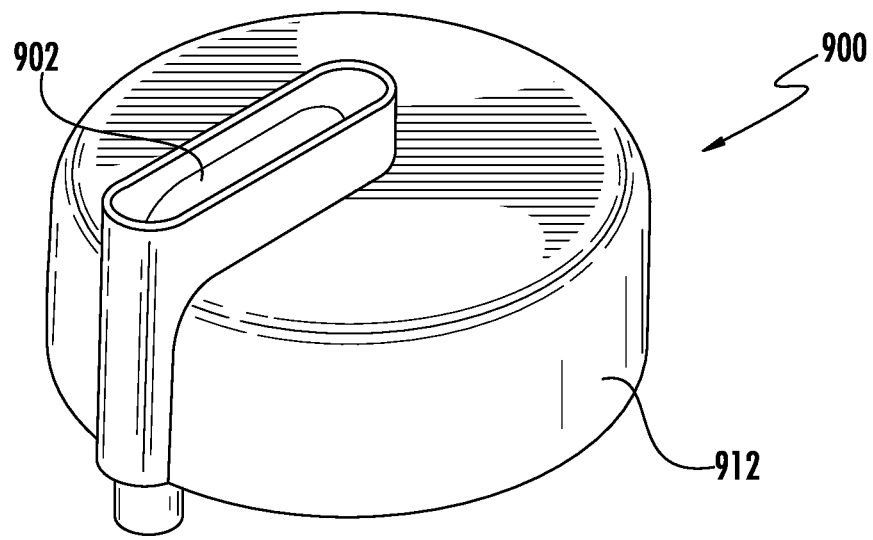
Figure 9C:
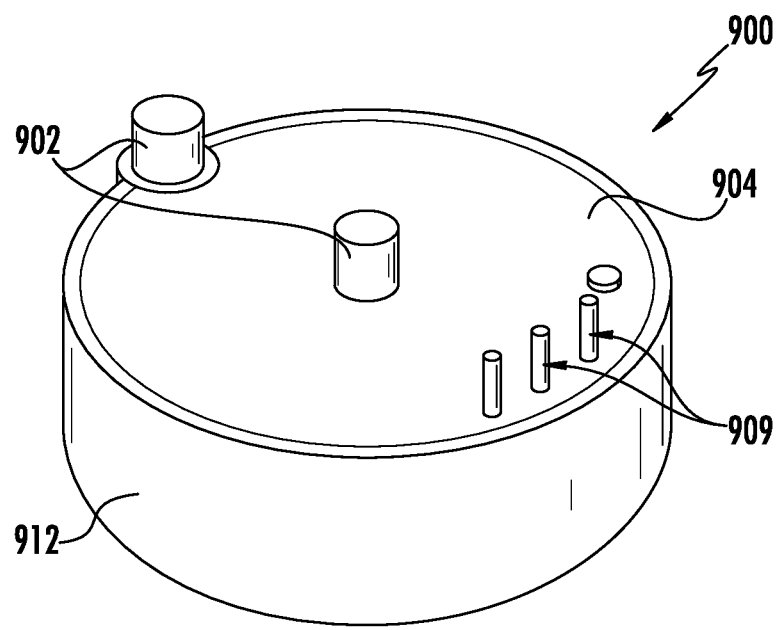

FIGS. 9A-9C illustrate yet another embodiment of the current sensing apparatus of the disclosure. In this embodiment, the apparatus 900 includes a plurality of sensing elements 903a-d (here four, although any number may be used), a base element 904 with aperture(s) 906 for the bus bar 902, a cover element 912, and a plurality of conductive terminals 909. As illustrated, the sensing elements 903a-d may be joined in a "ring" formation, and are received onto the base 904 (FIG. 9A). The cover 912 snapped or fit into place over the elements 903 and base 904, and the bus bar 902 is then inserted through the aperture(s) in the cover, and the aperture(s) 906 in the base element 904 such that the bus bar ends protrude from the bottom of the device (FIG. 9C). Similar to the embodiment of FIG. 8A-8H, the apparatus 900 of FIGS. 9A-9C may include plastic components for low cost and lightweight, as well as electromagnetic and/or electrostatic shielding if desired. Different terminal configurations and/or geometries will also be readily implemented by those of ordinary skill when given the present disclosure.

Asymmetric Variants—

In another aspect of the disclosure, certain asymmetries or other variations in the previously referenced designs are exploited so as to, inter alia, (i) account for bus bar profiles or shapes (or relative dispositions with respect to nearby components, such as other bus bars, etc.) which would otherwise cause the sensing apparatus to have a larger total size or volume; and/or (ii) account for variations in magnetic field density around the bus bar(s) such that greater sensing apparatus current sensitivity is provided.

Figure 10A:
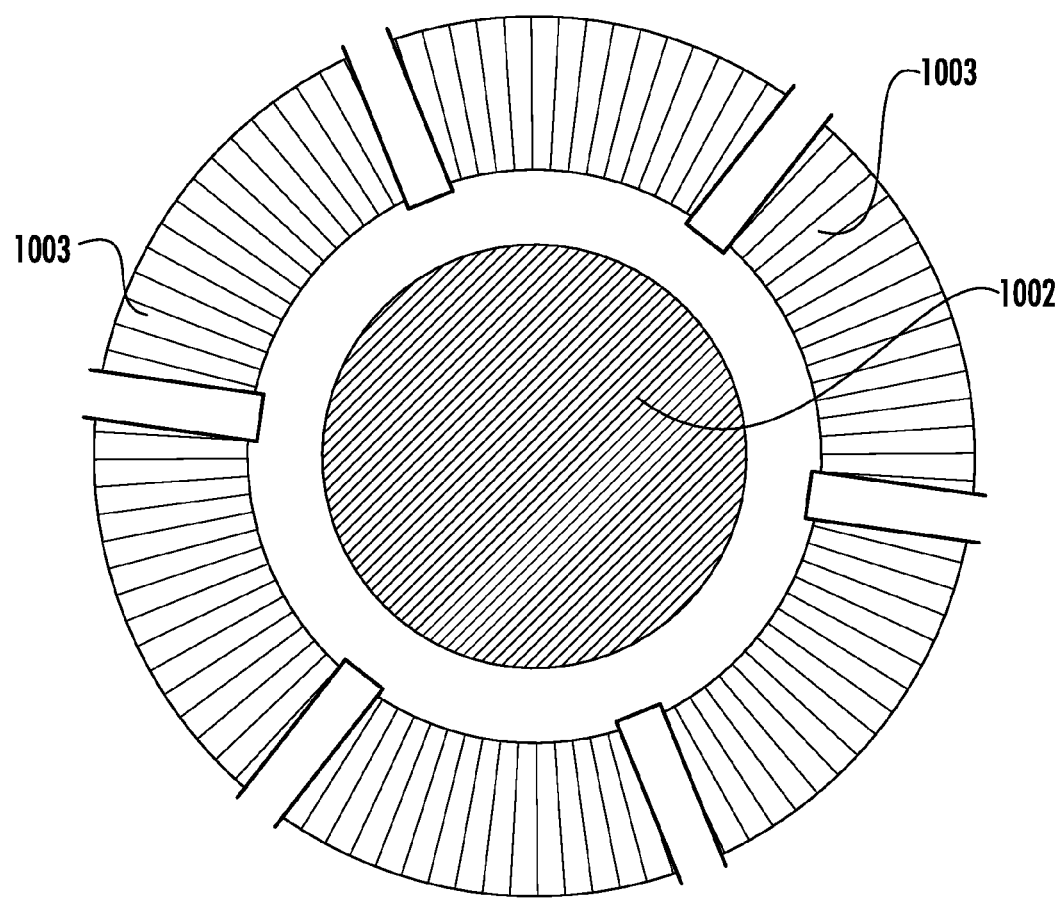
FIG. 10A is a top elevation view of one embodiment of an "asymmetric" sensing apparatus, wherein asymmetric (here, curved) bobbins with varying coil turn density is utilized, along with a substantially round central bus bar.

In one such asymmetric embodiment of the sensing apparatus, a plurality of substantially identical sensing segment windings are utilized, such that the overall shape of the sensing apparatus is generally symmetric (e.g., round, as shown in FIG. 10A). In this illustration, the sensing wedges 1003 are formed using bobbin elements that are curved, but of substantially constant radius and spool diameter. This configuration produces, when the sensing coil windings are wound thereon, a higher density of sensing coil turns per degree of angular displacement or azimuth at the inner radius of each bobbin as compared to that at the outer radius. This approach also allows for a more spatially compact overall sensing apparatus form factor as compared to an equal number of straight (i.e., infinite radius) bobbin segments, effectively by taking away wasted space at the corners of each bobbin's intersection with its neighbor.

Figure 10B:
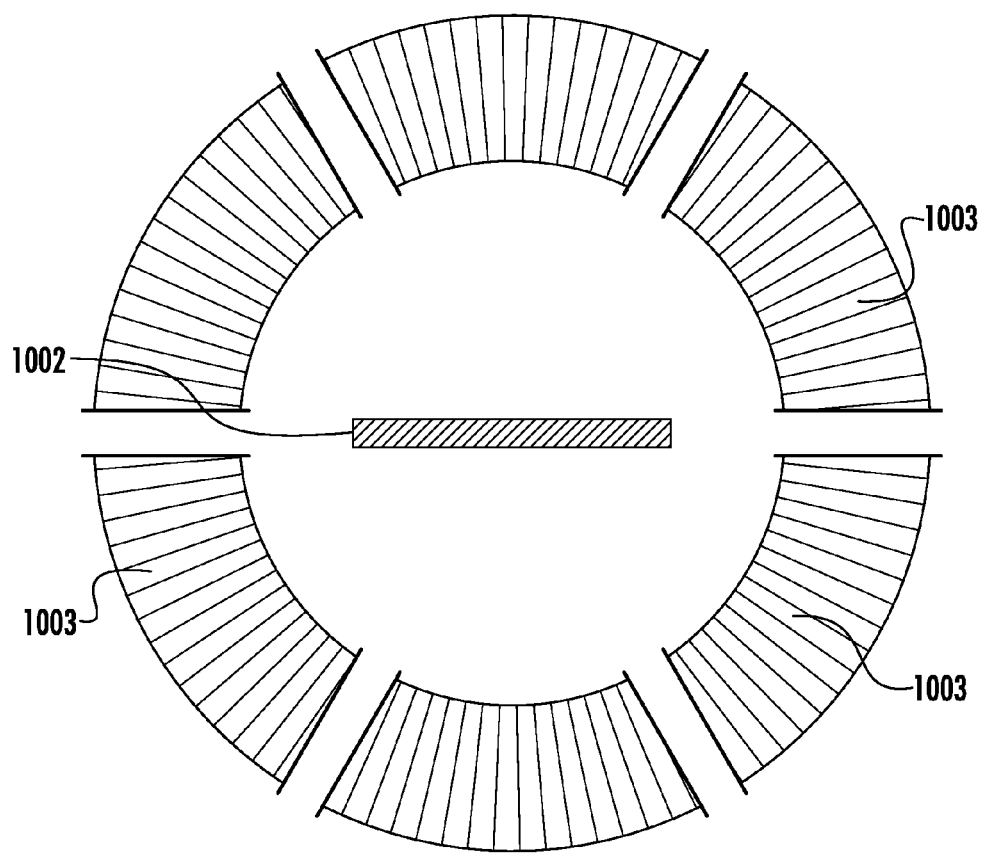
FIG. 10B is a top elevation view of another embodiment of an "asymmetric" sensing apparatus, wherein asymmetric (here, curved) bobbins with varying coil turn density is utilized, along with a rectangular bus bar that substantially bisects the apparatus.

It will be appreciated that while a round bus bar is illustrated in FIG. 10A, any number of different bus bar shapes and/or orientations (see, e.g., those of FIGS. 1-7 herein) may be used consistent with this approach as well. See for instance the configuration of FIG. 10B, wherein a rectangular (more flat, plate-like) bus bar is utilized, and sized such that it bisects the otherwise substantially round shape of the apparatus.

In another such "asymmetric" embodiment of the sensing apparatus, two or more different shapes or types of bobbin elements 1103 are employed within the same apparatus. Such heterogeneous configurations may be useful for example to accommodate particular bus bar shapes, such as the rectangular bus bar 1102 shown in FIG. 11A. In the illustrated exemplary implementation, three (3) different bobbin/winding configurations are used; namely: (i) elongated cylindrical bobbins 1103a on the long sides of the rectangular bus bar 1103a; (ii) shorter cylindrical bobbins 1103b at the ends of the rectangle, and (iii) curved cylindrical bobbins 1103c at the four corners.

Figure 11A:
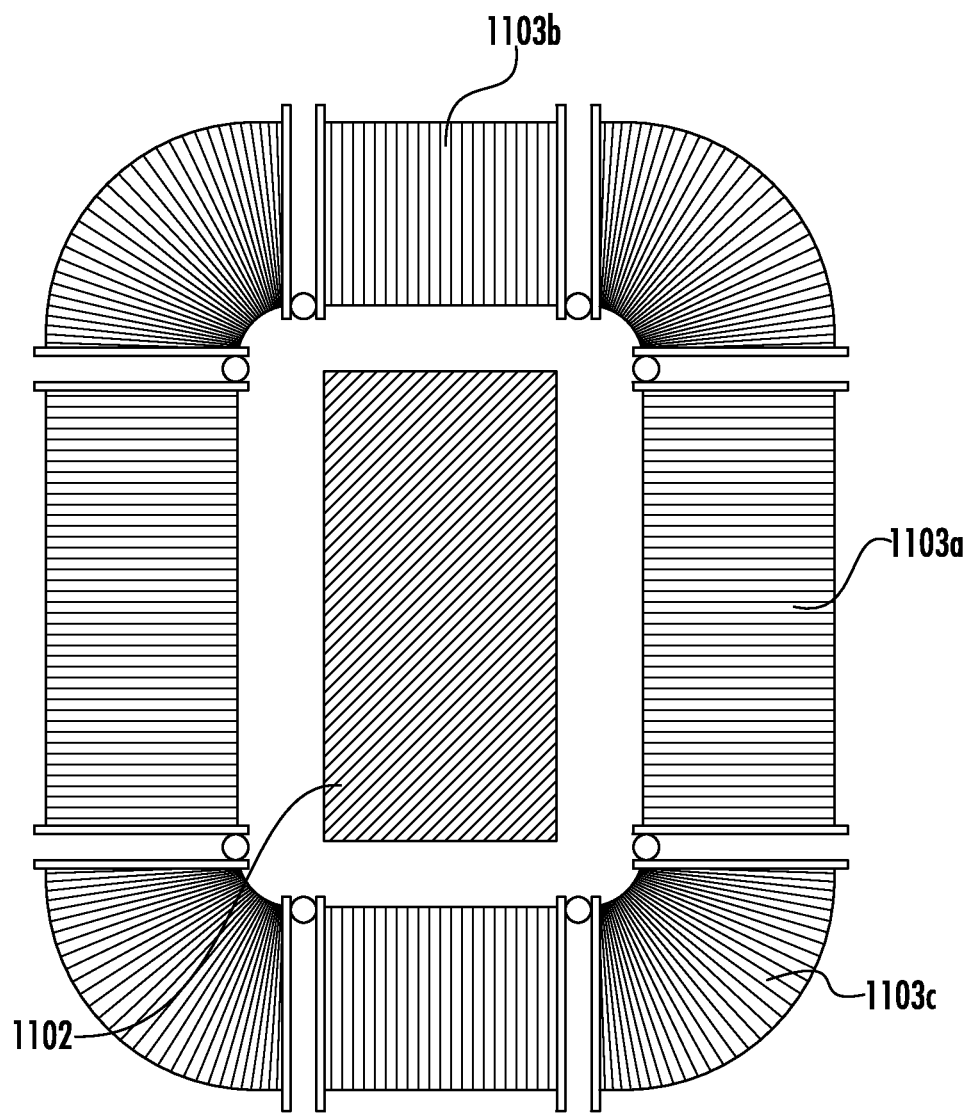
FIG. 11A is a top elevation view of one embodiment of an "asymmetric" heterogeneous coil sensing apparatus.
Figure 11B:
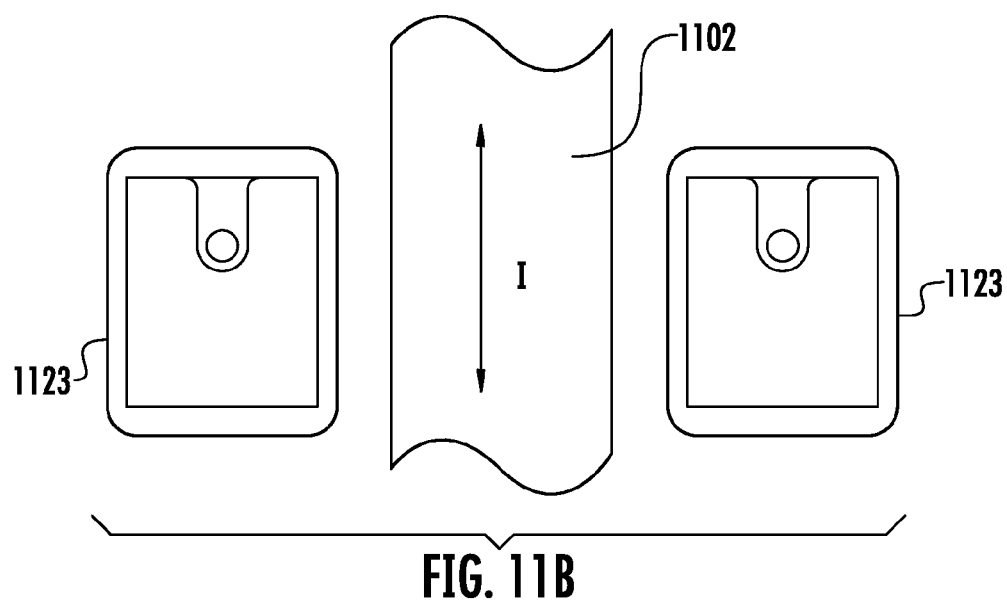
FIG. 11B is a cross-section view of another embodiment of an "asymmetric" heterogeneous coil sensing apparatus, wherein substantially square cross-section bobbins are used.
Figure 11C:
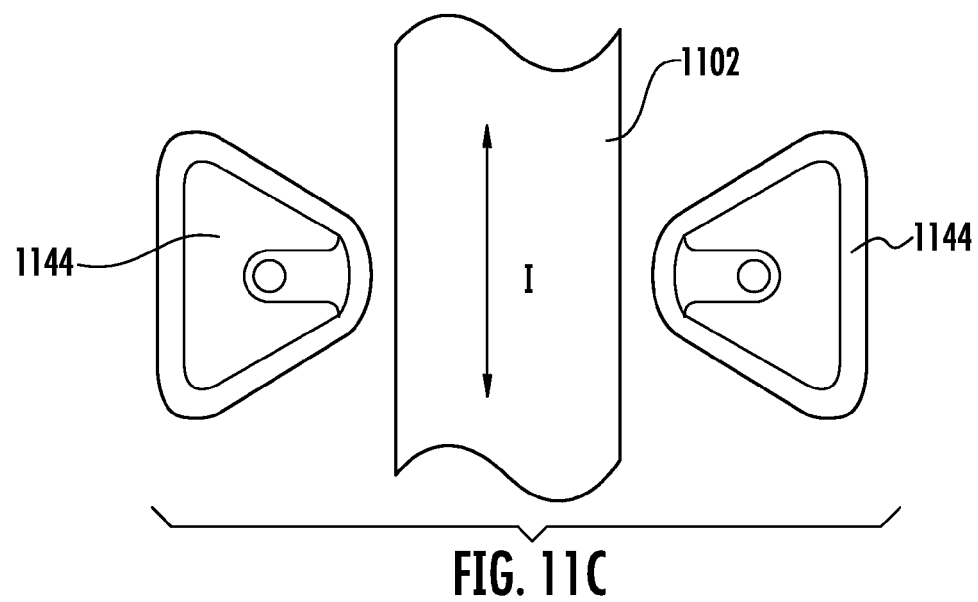
FIG. 11C is a cross-section view of yet another embodiment of an "asymmetric" heterogeneous coil sensing apparatus, wherein substantially wedge-shaped cross-section bobbins are used.

It will also be appreciated that, as shown in FIGS. 11B and 11C, other symmetric or non-symmetric cross-sections of bobbin may be utilized (i.e., other than the cylindrical cross-section described with respect to FIG. 11A). For example, the square cross-section bobbins 1123 shown in FIG. 11B, or wedge-shaped bobbins 1144 in FIG. 11C, could be used (such as with the heterogeneous configuration of FIG. 11A, just with square or wedge-shaped bobbins substituted) so as to present a uniform sensing coils face to the sensed sides of the bus bar 1102. Other cross-sectional shapes (whether symmetric or not) may be used consistent with the disclosure as well, such as (without limitation) rectangles, triangles, ovals/ellipses, and so forth.

In another embodiment, a non-symmetrical coil area is utilized. For example, in one implementation, the number of winding turns is varied on an inter-bobbin basis (i.e., from bobbin to bobbin, whether adjacent or otherwise). In one such inter-bobbin variant (not shown), the number of winding turns (i.e., winding density) on certain bobbins is higher than that on other bobbins, such as e.g., where the bobbins closest to the ends of the bus bar 102 in the apparatus 100 of FIG. 1 discussed supra have a greater or lesser density than the other bobbins not so close to the bus bars.

In another such variant, the bobbins are distributed according to winding density in a gradient (e.g., the sensing apparatus 100 of FIG. 1 is modified such that one side has the bobbin with highest winding density, and the other diametrically opposed side has the bobbin with lowest winding density, while those in between on either side have winding density values between the two extremes.

In one exemplary intra-bobbin variant, the flux density profile of the bus bar or other conductor to be sensed is mapped (whether theoretically or by modeling, of based on empirical measurement or observation), and the winding density across each bobbin adjusted as a function of its length so that the ratio of flux density to turn density (area) is substantially constant, or comports with another desired profile or relationship. This adjustment obviously may also be done more coarsely on an inter-bobbin basis, especially where there is a relatively small granularity (i.e., a large number of individual bobbins relative to the size of the sensed bus bar).

Figure 19:
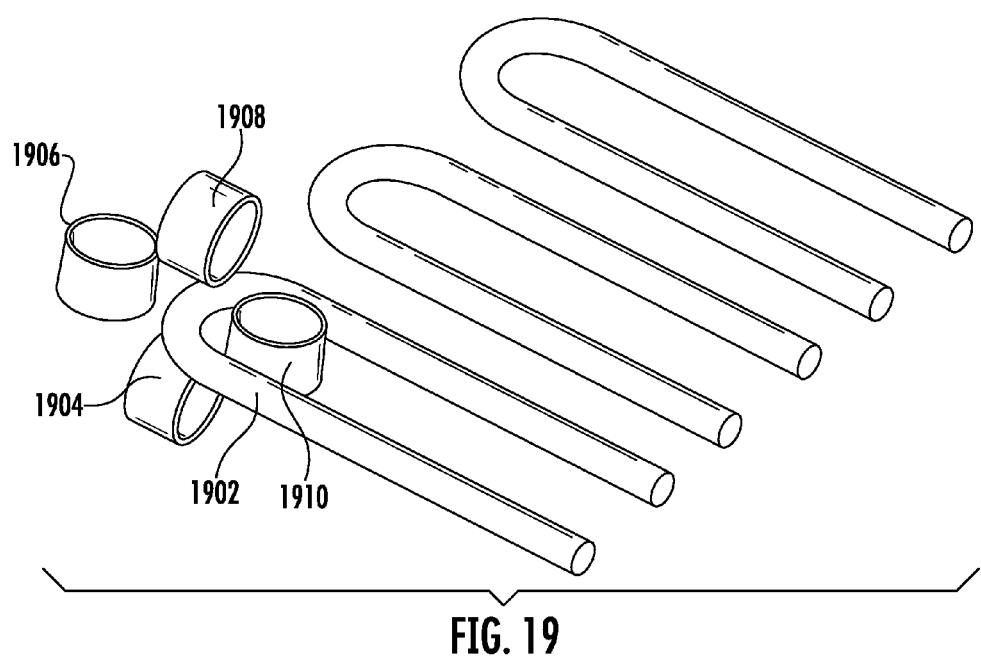
FIG. 19 is a perspective view illustrating the disposition of a first exemplary configuration of sensing elements (coils) relative to a three-phase bus bar in accordance with an embodiment of the present disclosure.

See also the discussion of various "asymmetric" sensing configurations particularly adapted for three-phase applications, described infra with respect to FIG. 19, et seq.

Multi-Phase Implementations—

Exemplary implementations of the sensing coil apparatus of the disclosure particularly adapted for multi-phase (e.g., three-phase or 3φ) applications are now described.

It will be appreciated that while a generally round cross-sectional bus bar is shown in the embodiments of FIGS. 15 through 21 herein, the use of such shape is merely for purposes of illustration, and in fact one or more of the bus bars may take on other cross-sectional shapes such as (without limitation) rectangular, square, elliptical, oval ("racetrack" shape), star-shaped, cruciform, and so forth, consistent with the present disclosure.

Sensor Apparatus Placement

Figure 15:
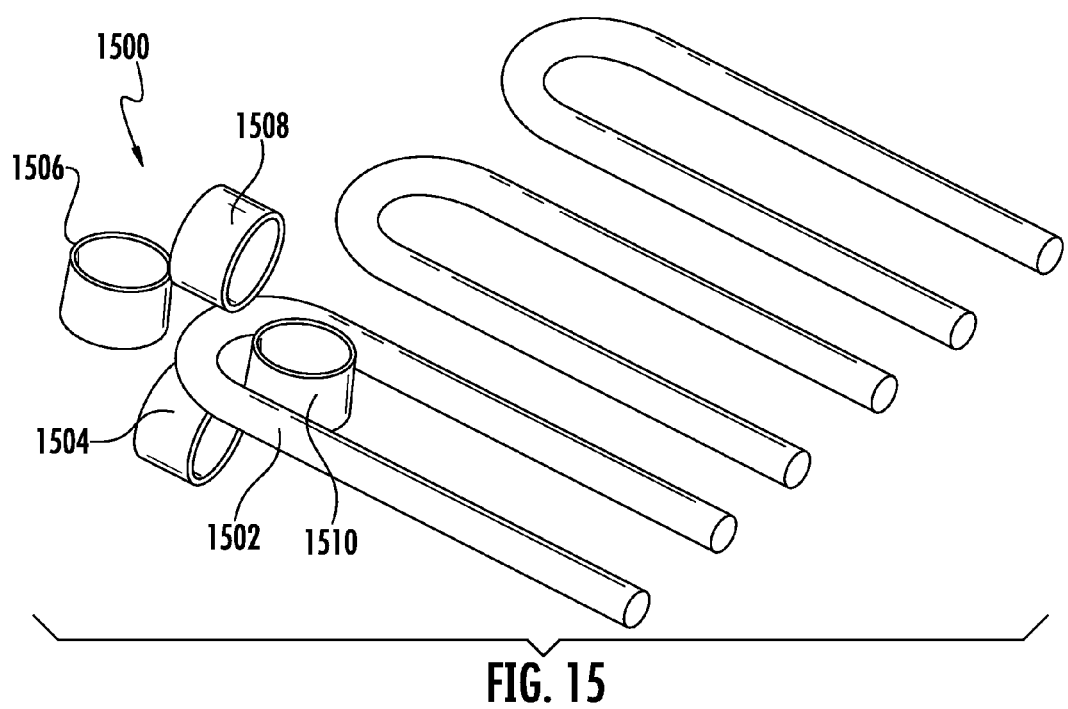
FIG. 15 illustrates an exemplary 4-segment current sensor arrangement, disposed around one bus bar of a three-phase system.
Figure 16:
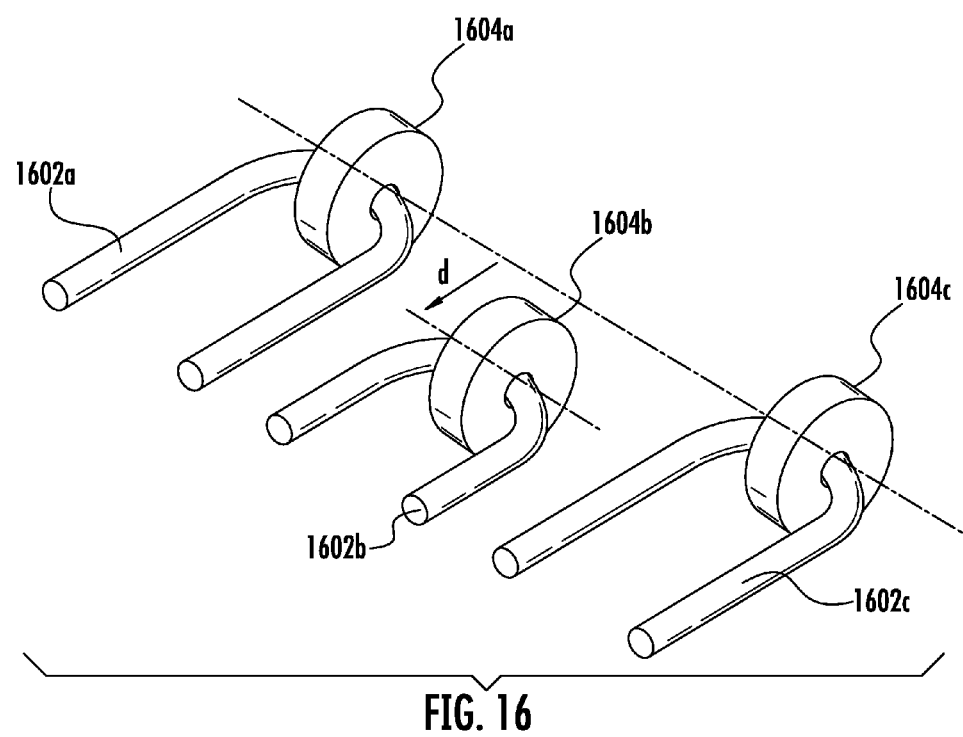
FIG. 16 is a perspective view illustrating the disposition of a first exemplary configuration of sensing apparatus relative to three-phase bus bars (middle bar offset), in accordance with an embodiment of the present disclosure.

FIG. 15 illustrates an exemplary 4-segment current sensor arrangement 1500, disposed around one bus bar 1502 of a three-phase system.

In another embodiment of the disclosure (FIG. 16), the center sensor element 1604b and its associated center bus bar 1602b are offset longitudinally a distance d within the common plane of the three bus bars 1602a, 1602b, 1602c, so that the sensor 1604 is located in the area of more uniform field between two side or lateral current sources (i.e., the other two bus bars). As can be appreciated, the longitudinal offset of the center bus bar 1602b may be in the opposite direction if desired, or even out of the common plane of the other bus bars (i.e., upward or downward relative to the common plane).

Figure 17:
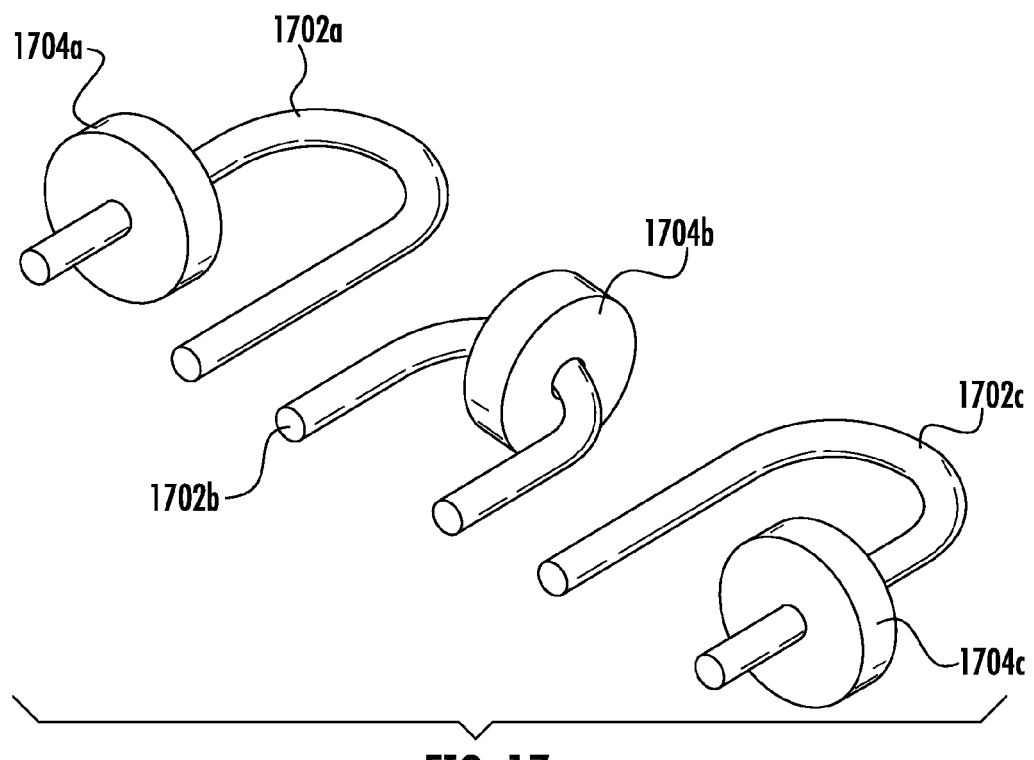
FIG. 17 is a perspective view illustrating the disposition of a second exemplary configuration of sensing apparatus relative to three-phase bus bars (middle bar offset, and outer sensing apparatus disposed laterally), in accordance with an embodiment of the present disclosure.

In yet another embodiment, the outer sensor elements 1704a, 1704c are positioned on the straight outside lateral portions of their respective bus bars 1702a, 1702c so as to be away as possible from the center current source, as shown in FIG. 17. It will be appreciated that while the embodiment of FIG. 17 is shown having the dislocated center bus bar as described above with respect to FIG. 16, this is merely but one possible implementation and combination, and the lateral positioning of the outer sensors as shown in FIG. 17 may be used alone, or in combination with yet other techniques.

In yet a further embodiment (FIG. 18), the outer bus bars 1802a, 1802c are both (i) rotated ninety (90) degrees relative to the center bus bar 1802b (including their respective sensors 1804a, 1804c), and (ii) the bus bars are shaped so that their lateral elements 1812 are not coplanar with one another (i.e., are offset in one direction by distance $d_1$, and in a second direction by distance $d_2$, which may or may not equal one another). This approach ostensibly produces enhanced cross talk immunity relative to the center current source. Additionally, the diagonal bus bar ends advantageously provide a larger opening by which to install the sensor onto the bus bars.

Figure 18:
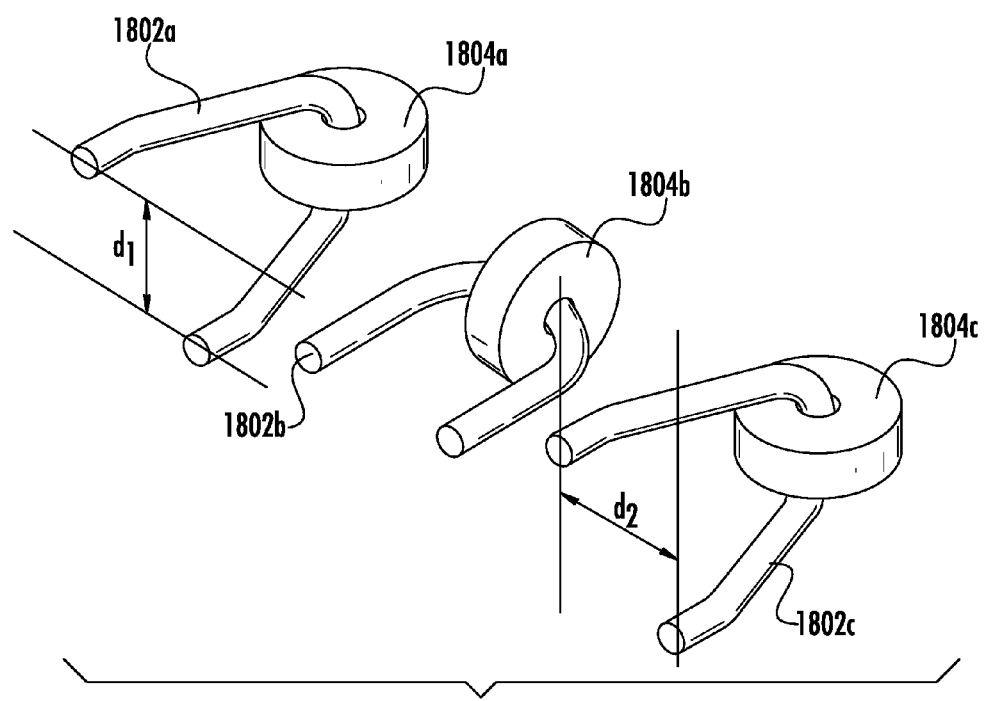
FIG. 18 is a perspective view illustrating the disposition of a third exemplary configuration of sensing apparatus relative to three-phase bus bars, in accordance with an embodiment of the present disclosure.

As with the embodiment of FIG. 17, it will be appreciated that while the embodiment of FIG. 18 is shown having both the features (i) and (ii) described above (and the aforementioned offset of the middle bar), this is merely but one possible implementation and combination, and the (i) rotation, (ii) non-coplanar shape, and offset may each also be used alone, or in combination with yet other techniques, such as those of FIG. 17 described above.

Sensing Element Placement

While FIGS. 15 through 18 discussed above deal with the placement of the sensing apparatus (i.e., aggregations of two or more sensing elements or coils) as a whole, the placement and configuration of the individual sensing elements (coils) which make up each apparatus must also be considered in order to optimize overall performance on multi-phase systems. According, various embodiments of the sensing apparatus, and specifically individual sensing element placement and configuration, are now described with respect to FIGS. 19-21.

FIG. 19 illustrates one exemplary implementation of the multi-segment sensor apparatus configured to, inter alia, minimize the magnetic influence from nearby phases in a multi-phase system. In this embodiment, a four (4)-segment sensor is placed on a first three-phase current source (phase 1).

In this embodiment, two different configurations of sensor element (segment) are used; so-called (i) uniform sensor elements having n (here, 170 turns) thereon; and (ii) non-symmetrical sensor elements having in (here, 192) turns thereon. In the illustrated embodiment, the third sensor element 1906 is a non-symmetrical element, while the remaining sensor elements 1904, 1908, 1910 are symmetrical elements. The use of additional turns on the non-symmetrical element, and placement thereof relative to the bus bar 1902 and the other elements 1904, 1908, 1910, advantageously increases the immunity to external magnetic fields that can be achieved. Moreover, the diameter of the sensor element(s) may be altered so as to for example affect immunity to external fields and/or sensitivity of the sensing apparatus.

Figure 20:
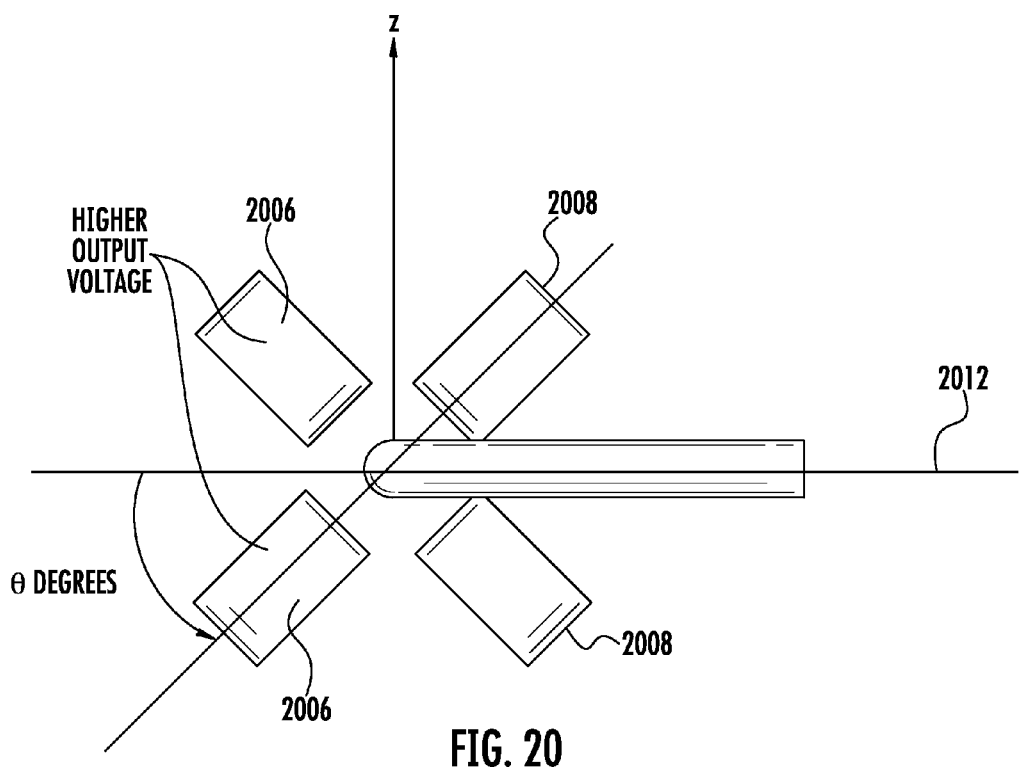
FIG. 20 is a perspective view illustrating the disposition of a second exemplary configuration of sensing elements (coils) relative to a three-phase bus bar in accordance with an embodiment of the present disclosure.

In another embodiment shown in FIG. 20, the four sensing segments (coils) are disposed similarly to those in FIG. 19, yet are rotated 9 degrees (relative to the plane 2012 encompassing the bus bar 2002). The two outer elements 2006 are in one implementation non-symmetric elements, while the remainder of the elements 2008 are uniform elements, although this is not a requirement of this embodiment.

Moreover, the angle θ may be adjusted so as to optimize immunity to nearby external magnetic fields induced (e.g., by other phases), and is to some degree dependent on the sensor configuration (e.g., for four segments in the sensor apparatus, a θ of 22.5 degree is optimal).

The configuration of FIG. 20 produces a greater output voltage on the two non-uniform elements 2006 than the uniform ones 2008. This advantageously produces have less difference among each segment than adjusting only one segment as in the configuration of FIG. 19.

Figure 21:
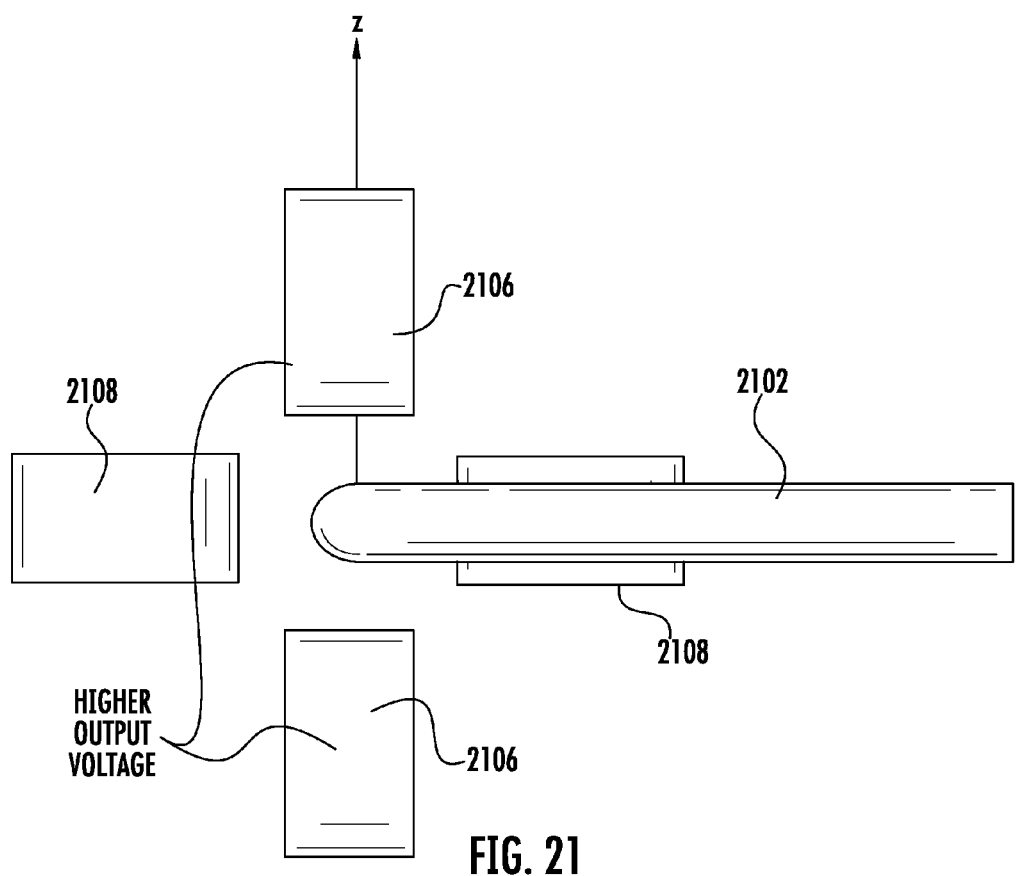
FIG. 21 is a perspective view illustrating the disposition of a third exemplary configuration of sensing elements (coils) relative to a three-phase bus bar in accordance with an embodiment of the present disclosure.

In yet another embodiment shown in FIG. 21, the four sensing segments (coils) are disposed similarly to those in FIG. 19, yet the two outer elements 2106 are non-symmetrical elements, while the remainder of the elements 2108 are symmetrical elements. For example, in one exemplary implementation, the difference in symmetry is reflected in the number of turns, and/or diameter of winding area. This advantageously produces less difference among each segment than adjusting only one segment (as in the configuration of FIG. 19), and moreover has enhanced symmetry over the embodiment of FIG. 20, while maintaining substantial immunity to external uniform magnetic fields as well.

Exemplary Current Sensing Apparatus Applications—

The exemplary current sensing apparatus described herein can be used in any large number of applications, and/or where it is desirable to measure the current of one or more conductors without otherwise disturbing the current carrying conductor itself. One such common application is in the incorporation of current sensing apparatus in electrical meters for use in residential, commercial and industrial applications. By measuring the current being consumed by a consumer of electricity, and passing this information along to the utility company via a network interface on the meter, the utility company or other entity can better gauge what to charge its consumers, and/or better understand the energy being consumed throughout various parts of an electricity grid or system.

As well as being resistant to tampering and electromagnetic interference, current sensing apparatus such as Rogowski coils have wide applicability to various applications included in the recent push towards so-called smart grids. Furthermore, in addition to being utilized in power distribution metering applications (such as circuit breakers, residential and industrial monitoring stations, etc.), the use of current sensing apparatus in a wide variety of appliance applications which utilize large amounts of current (such as for example, electric welders and motor controls) are envisioned as well.

Multi-phase (e.g., three-phase) applications may include for example (and without limitation) commercial or industrial applications, use at power generating facilities such as nuclear, coal-fired, natural gas, hydroelectric, or other such plants, and even use in government or military applications such as shipboard three-phase systems, national laboratories, and the like.

It will be recognized that while certain aspects of the disclosure are described in terms of a specific sequence of steps of a method, these descriptions are only illustrative of the broader methods of the disclosure, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the disclosure disclosed and claimed herein.

While the above detailed description has shown, described, and pointed out novel features of the disclosure as applied to various embodiments, it will be understood that various omissions, substitutions, and changes in the form and details of the device or process illustrated may be made by those skilled in the art without departing from the disclosure. The foregoing description is of the best mode presently contemplated of carrying out the disclosure. This description is in no way meant to be limiting, but rather should be taken as illustrative of the general principles of the disclosure. The scope of the disclosure should be determined with reference to the claims.

What is claimed is:

1. A current sensing inductive device, comprising:
   a plurality of coil-like sensing elements; and
   a hinged housing having both an open and a closed form, the hinged housing having an aperture associated therewith, the hinged housing further configured to articulate about a hinge;
   wherein the hinged housing comprises one or more snap features disposed at a perimeter region thereof external to the aperture, the one or more snap features configured to maintain the hinged housing in the closed form; and
   wherein the one or more snap features are disposed on an opposing side of the aperture with respect to the hinge.

2. The device of claim 1, wherein the plurality of coil-like sensing elements are collectively configured to be disposed in a predefined position relative to a sensed structure via one or more bus bar retaining elements when the hinged housing is in the closed form.

3. The device of claim 2, wherein the sensed structure comprises a bus conductor associated with one phase of a multiple-phase electrical system.

4. The device of claim 2, wherein the predefined position comprises positioning the sensed structure in a plane that bisects the housing in two portions of approximately equal size.

5. The device of claim 4, wherein the predefined position further comprises positioning the sensed structure in a plane that is centered on an interface between two adjacently disposed coil-like sensing elements.

6. The device of claim 5, wherein the one or more bus bar retaining elements receives the sensed structure at only the ends of the sensed structure.

7. A current sensing inductive device, comprising:
   a plurality of coil-like sensing elements; and
   a hinged housing having both an open and a closed form, the hinged housing having an aperture associated therewith, the hinged housing further configured to articulate about a hinge;
   wherein the hinged housing comprises a snap feature disposed at a perimeter region thereof external to the aperture, the snap feature configured to maintain the hinged housing in the closed form;
   wherein the hinge is disposed between two adjacently disposed coil-like sensing elements; and
   wherein the snap feature is disposed between two other adjacently disposed coil-like sensing elements.

8. The device of claim 7, wherein the plurality of coil-like sensing elements are collectively configured to be disposed in a predefined position relative to a sensed structure via one or more bus bar retaining elements when the hinged housing is in the closed form.

9. The device of claim 8, wherein the sensed structure comprises a bus conductor associated with one phase of a multiple-phase electrical system.

10. The device of claim 8, wherein the predefined position comprises positioning the sensed structure in a plane that bisects the housing in two portions of approximately equal size.

11. The device of claim 10, wherein the predefined position further comprises positioning the sensed structure in a plane that is centered on an interface between two adjacently disposed coil-like sensing elements.

12. The device of claim 11, wherein the one or more bus bar retaining elements receives the sensed structure at only the ends of the sensed structure.

13. A current sensing inductive device, comprising:
a plurality of coil-like sensing elements; and
a housing comprising at least an open and a closed form, the at least a portion of the housing being configured to articulate about a hinge, the housing further comprising:
 a substantially circular aperture comprising a plurality of recesses configured to place a sensed element in a predefined position; and
 a snap feature disposed at a perimeter region of the housing and configured to maintain the housing in the closed form;
wherein:
 the snap feature is disposed on the housing substantially opposite from the hinge and across the substantially circular aperture;
 the hinge is disposed proximate a junction of first and second adjacently disposed coil-like sensing elements; and
 the snap feature is disposed proximate a junction of third and fourth adjacently disposed coil-like sensing elements.

14. The device of claim 13, wherein the sensed element comprises a bus conductor associated with one phase of a multiple-phase electrical system.

15. The device of claim 13, wherein the closed form is configured to enhance current-sensing sensitivity.

16. The device of claim 13, wherein the closed form is configured to reduce cross-phase interference.

17. The device of claim 13, wherein the predefined position comprises a position of the sensed element in a plane that bisects the housing into two portions of approximately equal size.

18. The device of claim 13, wherein the predefined position comprises a position of the sensed element in a plane that bisects the housing, and the plane is centered on an interface between the two adjacent coil-like sensing elements.

19. The device of claim 13, wherein the substantially circular aperture receives the sensed element only at ends of the sensed element.

20. The device of claim 13, wherein the device comprises an odd number of coil-like sensing elements.

* * * * *